(12) United States Patent
Hoque et al.

(10) Patent No.: US 10,297,419 B2
(45) Date of Patent: May 21, 2019

(54) SCANNING ELECTRON MICROSCOPE WITH CHARGE DENSITY CONTROL

(75) Inventors: Shahedul Hoque, Hitachinaka (JP); Hajime Kawano, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 13/981,175

(22) PCT Filed: Jan. 25, 2012

(86) PCT No.: PCT/JP2012/051530
§ 371 (c)(1),
(2), (4) Date: Jul. 23, 2013

(87) PCT Pub. No.: WO2012/102301
PCT Pub. Date: Aug. 2, 2012

(65) Prior Publication Data
US 2013/0306866 A1 Nov. 21, 2013

(30) Foreign Application Priority Data
Jan. 28, 2011 (JP) .................................. 2011-015903

(51) Int. Cl.
*H01J 37/28* (2006.01)
*H01J 37/147* (2006.01)

(52) U.S. Cl.
CPC .......... *H01J 37/28* (2013.01); *H01J 37/1474* (2013.01); *H01J 2237/004* (2013.01); *H01J 2237/0048* (2013.01); *H01J 2237/281* (2013.01)

(58) Field of Classification Search
CPC .............................................. H01J 2237/0048
See application file for complete search history.

(56) References Cited

U.S. PATENT DOCUMENTS

| | | | |
|---|---|---|---|
| 5,210,696 A * | 5/1993 | Yano | ............................... 430/30 |
| 5,412,209 A | 5/1995 | Otaka et al. | |
| 5,502,306 A * | 3/1996 | Meisburger et al. | ......... 250/310 |
| 6,344,750 B1 | 2/2002 | Lo et al. | |

(Continued)

FOREIGN PATENT DOCUMENTS

| | | | |
|---|---|---|---|
| JP | 05-151927 A | 6/1993 | |
| JP | 09-180667 A | 7/1997 | |

(Continued)

OTHER PUBLICATIONS

International Search Report in PCT/JP2012/051530 dated Feb. 21, 2012 with English Translation.

*Primary Examiner* — James Choi
(74) *Attorney, Agent, or Firm* — Volpe and Koenig, P.C.

(57) ABSTRACT

The present invention has an object to provide a scanning electron microscope which suppresses a potential gradient produced by preliminary charge without changing lens conditions of an electron microscope. As an aspect to achieve the above object, there is proposed a scanning electron microscope in which a scanning deflector is controlled so that a second beam is scanned to detect electrons released from a sample after scanning a first beam on the sample to charge the surface of the sample and the first beam is scanned so that charge density in a surrounding part within a scanned area by the first beam is increased relatively as compared with a center part within the scanned area by the first beam.

12 Claims, 24 Drawing Sheets

ORBIT OF PRIMARY BEAM ON SAMPLE

(56) References Cited

U.S. PATENT DOCUMENTS

| | | | |
|---|---|---|---|
| 6,570,154 B1 | 5/2003 | Masnaghetti et al. | |
| 6,635,873 B1 | 10/2003 | Todokoro et al. | |
| 7,615,747 B1* | 11/2009 | Brodie | 250/310 |
| 2006/0071167 A1* | 4/2006 | Todokoro et al. | 250/310 |
| 2008/0265160 A1* | 10/2008 | Ojima et al. | 250/311 |
| 2009/0084954 A1 | 4/2009 | Ezumi et al. | |
| 2010/0227200 A1* | 9/2010 | Miyata et al. | 428/800 |
| 2011/0155905 A1* | 6/2011 | Hatakeyama et al. | 250/307 |
| 2011/0159435 A1* | 6/2011 | Zable | G03F 1/78 430/296 |

FOREIGN PATENT DOCUMENTS

| | | |
|---|---|---|
| JP | 2000-200579 A | 7/2000 |
| JP | 2000-208085 A | 7/2000 |
| JP | 2000-331635 A | 11/2000 |
| JP | 2002-524827 A | 8/2002 |
| JP | 2004-227886 A | 8/2004 |
| JP | 2005-142038 A | 6/2005 |
| JP | 2007-059370 A | 3/2007 |
| JP | 2009-099540 A | 5/2009 |

* cited by examiner

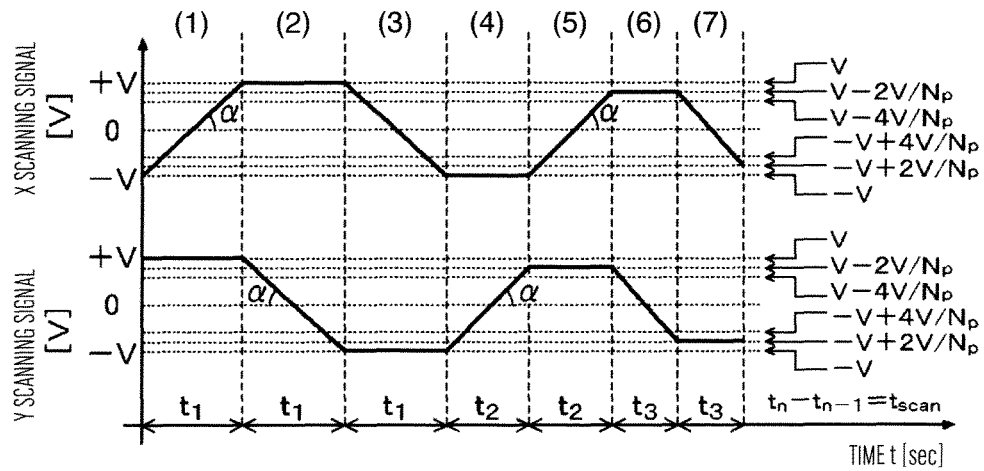
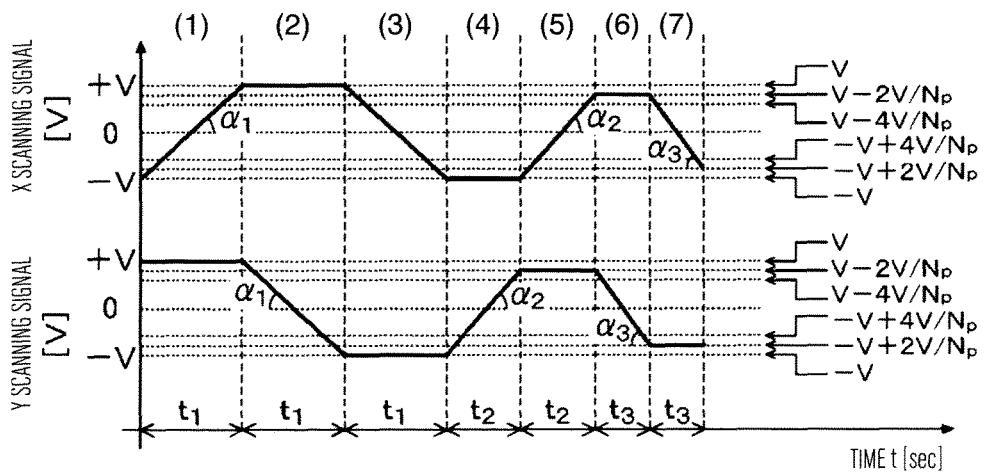

ORBIT OF PRIMARY BEAM ON SAMPLE

B: CHARGE DENSITY $\sigma > 0$

A: CHARGE DENSITY = 0
OR $0 <$ CHARGE DENSITY $< \sigma$

ORBIT OF PRIMARY BEAM ON SAMPLE

B : CHARGE DENSITY $\sigma > 0$

A : $0 <$ CHARGE DENSITY $< \sigma$

ORBIT OF PRIMARY BEAM ON SAMPLE

B : CHARGE DENSITY $\sigma > 0$

A : $0 <$ CHARGE DENSITY $< \sigma$

ORBIT OF PRIMARY BEAM ON SAMPLE

B : CHARGE DENSITY $\sigma > 0$

A : CHARGE DENSITY $= 0$
OR $0 <$ CHARGE DENSITY $< \sigma$

ORBIT OF PRIMARY BEAM ON SAMPLE

ORBIT OF PRIMARY BEAM ON SAMPLE

ORBIT OF PRIMARY BEAM ON SAMPLE

ORBIT OF PRIMARY BEAM ON SAMPLE

ORBIT OF PRIMARY BEAM ON SAMPLE

C: $0 <$ CHARGE DENSITY $< \sigma$
B: CHARGE DENSITY $\sigma$
A: CHARGE DENSITY $= 0$
   OR $0 <$ CHARGE DENSITY $< \sigma$

C : 0 < CHARGE DENSITY < σ

B : CHARGE DENSITY σ

A : 0 < CHARGE DENSITY < σ

SCANNING ELECTRON MICROSCOPE WITH CHARGE DENSITY CONTROL

RELATED APPLICATIONS

This application is the U.S. National Phase under 35 U.S.C. § 371 of International Application No. PCT/JP2012/051530, filed on Jan. 25, 2012, which in turn claims the benefit of Japanese Application No. 2011-015903, filed on Jan. 28, 2011, the disclosures of which Applications are incorporated by reference herein.

TECHNICAL FIELD

The present invention relates to a scanning electron microscope and more particularly to a preliminary charge method of charging a sample by scanning of electron beam and a scanning electron microscope which attaches preliminary charge to the sample.

BACKGROUND ART

A scanning electron microscope (SEM) is an apparatus which detects secondary electrons (SE) and backscattered electrons (BSE) released from a sample by irradiating the sample with an electron beam (hereinafter also referred to as a primary beam). The detected signal can be converted into an image or line profile to thereby observe, inspect or measure the sample. Electron microscopes are widely applied to measurement of semiconductor devices and measurement technique thereof must be applied to measurement of various patterns with miniaturization of semiconductor devices.

Recently, in particular, there is a need for observation and measurement of a hole structure having a high aspect ratio named a contact hole. The aspect ratio is a ratio of the depth and the diameter of a hole and a contact hole having the aspect ratio exceeding 30 is not rare. In order to observe the bottom of a contact hole having a high aspect ratio, the bottom of the hole must be irradiated with a primary beam and secondary electrons released from the bottom must be detected. However, in case of the hole having the high aspect ratio, there is a case where the secondary electrons released from the bottom collide with the side wall of the hole and cannot escape from the hole, so that it is difficult to observe the bottom of the hole.

In order to lead the electrons released from the hole bottom onto a sample, there is a known method in which the surface of the sample is charged positively.

Patent Literatures 1 to 5 disclose a method in which the surface of a sample is irradiated with a beam (first beam) to charge the sample surface and thereafter a beam (second beam) for detecting electrons for formation of an image or a line profile of a contact hole or the like is scanned. Since the first beam has the secondary electron emission efficiency η and the irradiation area larger than those of the second beam, the surface of the sample is charged positively. The sample being in the positively charged state is irradiated with the second electron beam and accordingly the electrons released from the bottom of the hole can be led to the outside of the hole to be detected with high efficiency.

CITATION LIST

Patent Literature

Patent Literature 1: JP-A-2000-208085 (corresponding to U.S. Pat. No. 6,344,750)
Patent Literature 2: JP-A-2002-524827 (corresponding to U.S. Pat. No. 6,570,154)
Patent Literature 3: JP-A-05-151927 (corresponding to U.S. Pat. No. 6,412,209)
Patent Literature 4: JP-A-2000-331635
Patent Literature 5: JP-A-2000-200579 (corresponding to U.S. Pat. No. 6,635,873)
Patent Literature 6: JP-A-2009-99540 (corresponding to USP 2009/0084954)

SUMMARY OF INVENTION

Technical Problem

According to the preliminary charge method (hereinafter also referred to as a pre-dose or pre-charge method) disclosed in Patent Literatures 1 to 5, electrons released from the bottom of the hole or the like can be detected with high efficiency, although since charge attached on the sample by the first beam is not uniform within the scanning range (field of view (FOV)) of the second beam, it is cleared by investigation of the Inventors that there is a possibility that there occurs deviation in the field of view, shift in the focus or distortion in the image.

High potential is maintained in the center of the scanning range of the electron beam as compared with the edge of the scanning range and accordingly there is a possibility that the charge potential has a gradient within the scanning range of the second electron beam and it causes the distortion in the image.

In order to suppress such a potential gradient, the Patent Literature 6 discloses a method in which a beam having the secondary electron emission efficiency ($\eta 1$)>1 is first used to make scanning on a sample and a different beam having the secondary electron emission efficiency ($\eta 2$) is secondly used to make scanning so as to flatten the potential gradient formed by the beam having the efficiency $\eta 1$, although a negative voltage applied to the sample is changed so as to change the secondary electron emission efficiency $\eta$ and accordingly an electrostatic lens formed by application of the negative voltage is changed. In this manner, the method in which the optical conditions of the electron microscope are changed takes time for adjustment of the lens conditions. Further, it is necessary to adjust the optical conditions twice before irradiation of the second beam and accordingly it takes a considerable time.

Moreover, since the charge is relieved gradually, it is necessary to decide the charge condition while considering the above-mentioned elapse of time and since the condition is different depending on material forming the sample, there is a possibility that the apparatus condition to be set is complicated.

A scanning electron microscope having an object to suppress a potential gradient in a scanned area by a second beam without changing the lens conditions of the electron microscope is described below.

Solution to Problem

As an aspect to achieve the above object, there is proposed a scanning electron microscope in which an electron beam is scanned so that charge density per unit area in an inner area within a scanned area by the electron beam is lower than charge density in an outer area within the scanned area and thereafter a scanning deflector is controlled so that an electron beam for detecting electrons by a detector is scanned on an area containing the inner area.

Advantageous Effects of Invention

According to the above aspect, a potential gradient of charge on a surface attached by preliminary charge irradiation can be suppressed on a scanned area by the electron beam for observation, inspection or measurement without changing lens conditions or the like of the electron microscope.

Other objects, features and advantages of the present invention will be apparent from the following description of embodiments of the present invention taken in connection with the accompanying drawings

BRIEF DESCRIPTION OF DRAWINGS

FIG. 4B illustrates a scanning signal for rectangular scanning;

FIG. 4C illustrates a scanning signal for rectangular scanning;

DESCRIPTION OF EMBODIMENTS

The scanned area of electron beam by an SEM has a two-dimensional spread and when the electron beam is scanned uniformly, there is a tendency that electric charge (charge) accumulated in the center of a scanned area is relatively high as compared with electric charge accumulated in the edge part of the scanned area. In other words, when a pre-dose method or pre-charge method in which charge is attached or formed on the surface of a sample aggressively is applied, a potential gradient is formed in an observation area. Since a potential gradient has deflection action to electron beam, it is considered that deviation in the field of view, shift in the focus or distortion in the image occurs and exact observation and measurement cannot be performed.

In the ordinary scanning method (e.g. raster scanning and the like), scanning is made on a fixed area at a fixed scanning speed and accordingly the attached charge potential has a gradient. When such a scanning method is applied to the pre-dose or pre-charge, the beam used at the time of observation has the orbit deflected by the lens action formed by the potential gradient. The reason thereof is described below. It is considered that the electric charge accumulated in a sample is uniformly distributed in a pre-dose area when the scanning speed at the time of pre-dose is fixed. FIG. 2 shows potential distribution at the time that uniform charge distribution exists in a finite area.

Figure 2A:
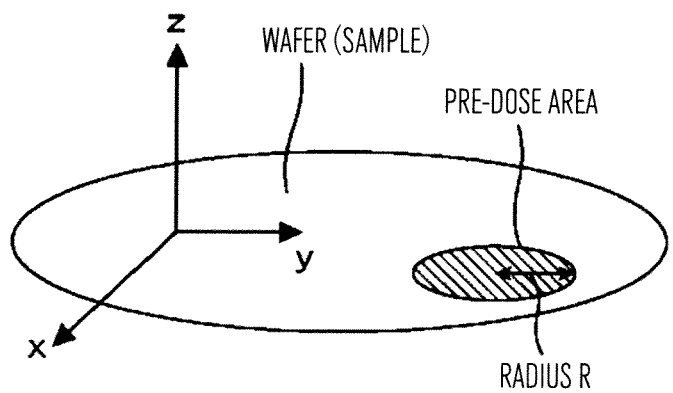
FIG. 2A illustrates the charge potential distribution in case where a pre-dose area is scanned at a fixed speed.
Figure 2B:
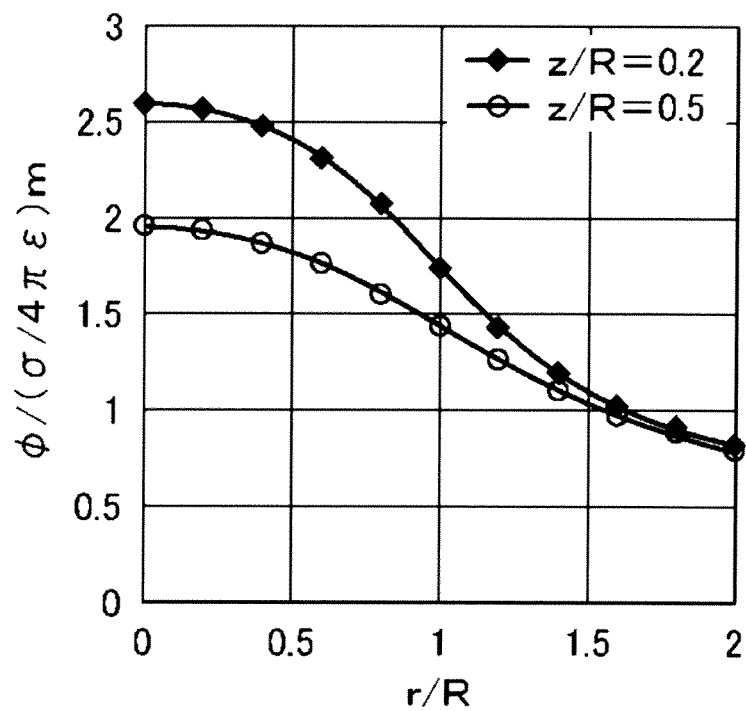
FIG. 2B illustrates the charge potential distribution in case where a pre-dose area is scanned at a fixed speed.

As shown in FIG. 2A, there is considered the case where a pre-dose area is a circle having a radius R and the accumulated charge density has a fixed value $\sigma$ in the area. FIG. 2B shows potential values calculated as a function of distance r at any point on a sample from the center of the circle and distance z from the sample. In this figure, the vertical axis represents potential $\Phi$ standardized by $\sigma/4\pi\varepsilon o$ in unit of m. Further, the horizontal axis represents a dimensionless amount of the distance r standardized by the radius R. It can be understood from this figure that the potential distribution is largest in the center part (r=0) of the pre-dose area and small in the surrounding part.

Accordingly, the potential distribution has a gradient in the direction of r, so that the lens action is produced. As a result, when a position apart from the center of the pre-dose area is observed, a primary beam deviates in the horizontal direction, so that there occurs deviation in the field of view or distortion in the image. In this manner, in the conventional pre-dose method, the secondary electrons from the bottom of the contact hole are detected easily, whereas deviation in the field of view and distortion in the image are produced by influence of charge at the time of observation and it is considered that exact measurement sometimes cannot be performed.

As described above, in the pre-dose using the general scanning method, since the charge density accumulated in the sample by pre-dose irradiation is distributed substantially uniformly, there is a case where the charge potential distribution has a horizontal gradient and the primary beam in observation is bent by the lens action. Accordingly, in the embodiment, there is described a scanning electron microscope in which the charge density in the surrounding part of the pre-dose area (area where the distance r is near to the radius R in FIG. 2) is increased and the charge density in the center part (area where the distance r is near to 0 in FIGS. 2A and 2B) is reduced, so that the charge potential distribution is made uniform. Concretely, it is considered that the pre-dose area is divided into an area which is irradiated with an electronic beam and an area which is not irradiated with the electronic beam to form desired charge distribution. Further, even by adjusting the scanning speed of the primary beam in pre-dose irradiation so that the irradiation amount is increased in the surrounding part of the pre-dose area and is reduced in the center part, the desired charge distribution may be attained.

According to the above-described configuration, next-generation semiconductor devices can be observed and measured exactly.

Figure 1:
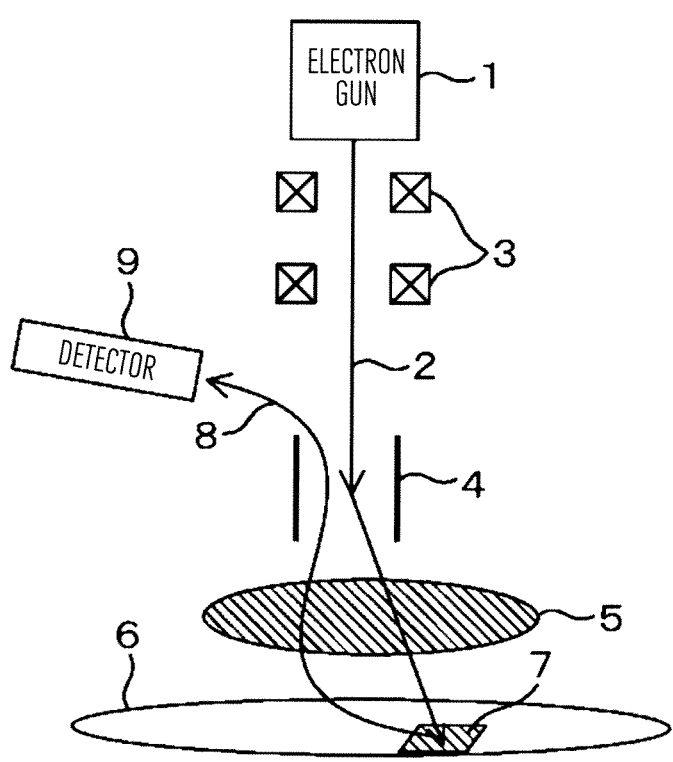
FIG. 1 is a diagram schematically illustrating a scanning electron microscope.

FIG. 1 schematically illustrates a scanning electron microscope. An electron beam 2 emitted by an electron gun 1 is converged by condensing lenses 3 and finally converged or focused on a sample by an objective lens 5. The electron beam 2 is scanned on a beam scanned area 7 of the sample by a deflector 4. Secondary electrons 8 excited within the sample by irradiation of primary beam and released from the sample are detected by a detector 9 and a signal of electrons is converted into an image to thereby observe and measure the sample.

Figure 19:
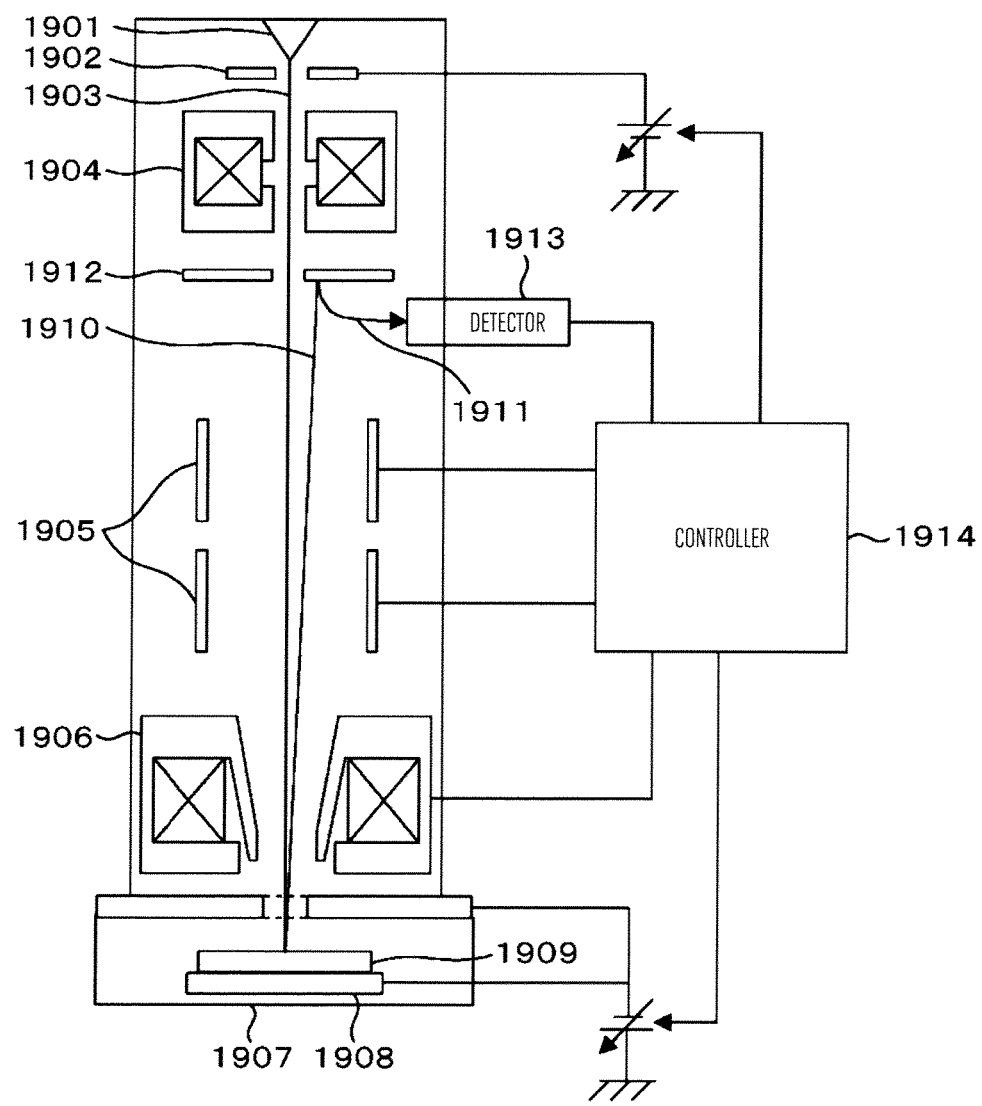
FIG. 19 is a schematic diagram illustrating a scanning electron microscope.

FIG. 19 is a schematic diagram illustrating the scanning electron microscope in more detail. An electron beam 1903 drawn out from an electron source 1901 by a drawing electrode 1902 and accelerated by an acceleration electrode not shown is converged by a condensing lens 1904 which is a form of a converging lens and is then scanned on a sample 1909 one- or two-dimensionally by scanning deflectors 1905. The electron beam 1903 is decelerated by negative voltage applied to an electrode included in a sample stage 1908 and is focused by the lens action of an objective lens 1906, so that the sample 1909 is irradiated with the electron beam.

When the sample 1909 is irradiated with the electron beam 1903, electrons 1910 such as secondary electrons and backscattered electrons are released from the irradiated place. The released electrons 1910 are accelerated by the acceleration action based on negative voltage applied to the sample in the direction of the electron source and collide with a conversion electrode 1912 to thereby generate secondary electrons 1911. The secondary electrons 1911 generated from the conversion electrode 1912 are caught by a detector 1913, of which output is changed depending on an amount of caught secondary electrons. The brightness of a display not shown is changed in accordance with the output. For example, when a two-dimensional image is formed, a deflection signal to the scanning deflectors 1905 is synchronized with the output of the detector 1913 to thereby form an image of a scanned area. Further, the scanning electron microscope illustrated in FIG. 19 includes a deflector (not shown) for moving the scanned area of the electron beam. This deflector is used to form an image or the like having a pattern of the same form existing in different positions. This deflector is also named an image shift deflector and can move a position of the field of view (FOV) of the electron microscope without moving the sample by means of the sample stage.

In an example of FIG. 19, electrons released from the sample are once converted by the conversion electrode to be detected, although it is a matter of course that the invention is not limited to such structure but, for example, a detection surface of the detector or an electron multiplier may be disposed on an orbit of the accelerated electrons. Further, the scanning electron microscope illustrated in FIG. 19 is equipped with an electrode or a magnetic pole named a blanker (not shown) for blanking the electron beam. The blanker deflects the electron beam so as to separate the electron beam from an ideal optical axis thereof so that unirradiation state of the electron beam to the sample is formed irrespective of other conditions of the scanning electron microscope.

A controller 1914 controls constituent parts of the scanning electron microscope and has the function of forming an image on the basis of the detected electrons and the function of measuring a width of pattern formed on the sample on the basis of the intensity distribution of the detected electrons named a line profile. Further, the scanning deflectors 1905 preferably adopts an electrostatic deflector which can make deflection at high speed but may adopt an electromagnetic deflector when the high-speed characteristic can be ensured.

Figure 24:
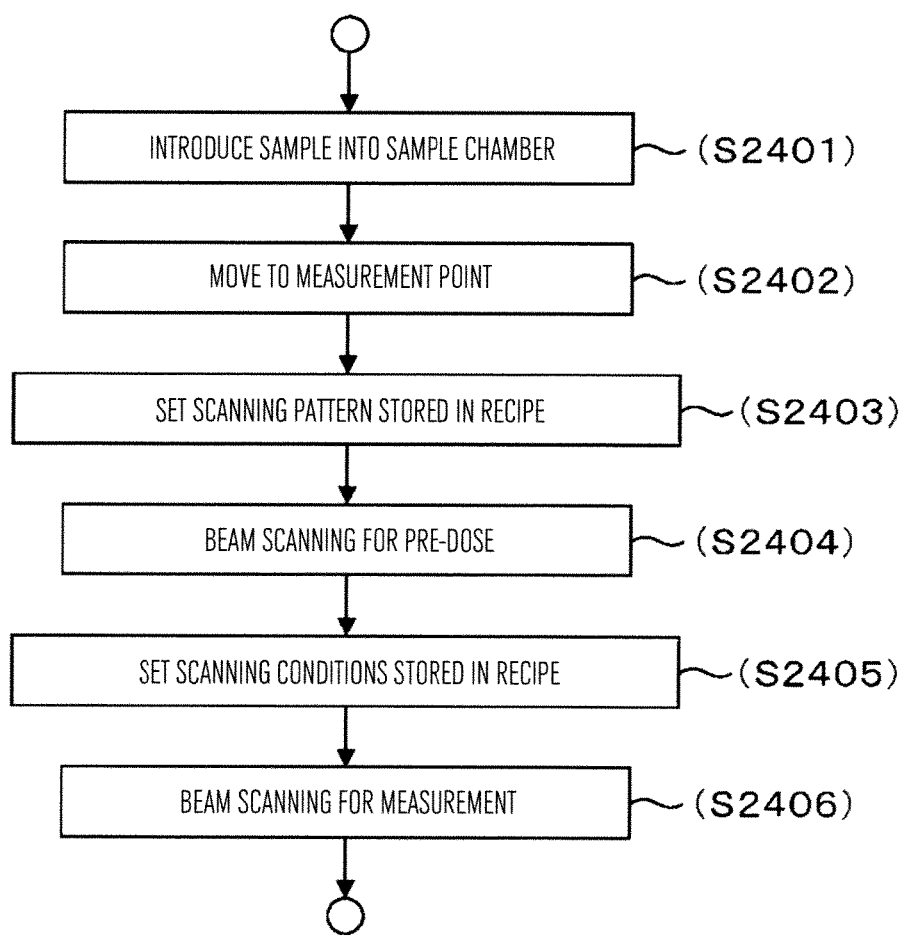
FIG. 24 is a flow chart explaining processes from pre-dose to measurement.

The process of making observation after the charge necessary to observe the contact hole having the high aspect ratio is formed is as follows. The controller 1914 controls constituent elements of the SEM in accordance with the process as illustrated in FIG. 24. First, the sample (semiconductor wafer or the like) is introduced into a sample chamber (step 2401) and a measurement point is moved to an irradiation position of beam by driving the sample stage or image shift (step 2402). Next, a scanning pattern stored in a previously registered recipe is read out to perform pre-dose (steps 2403 and 2404). Scanning conditions stored in the recipe in a corresponding manner to the charge area by pre-dose are read out to perform scanning of the beam for measurement (steps 2405 and 2406).

In regard to a deflection system for deflecting the electron beam, the scanning electron microscope capable of forming uniform charge in an observation area is now described with reference to the drawings.

Figure 3A:
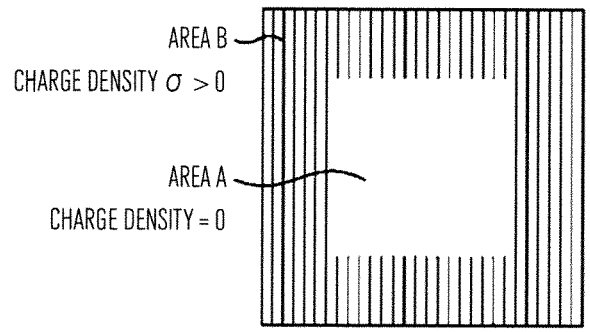
FIG. 3A illustrates the charge potential distribution in case where the charge densities on inner and outer sides of the pre-dose area are changed.
Figure 3B:
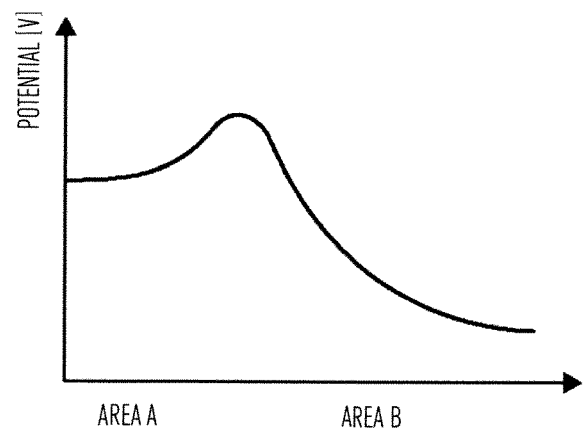
FIG. 3B illustrates the charge potential distribution in case where the charge densities on inner and outer sides of the pre-dose area are changed.

As shown in FIG. 2B, if the charge distribution in the pre-dose irradiation area is uniform, the charge potential distribution has a horizontal gradient. On the other hand, FIG. 3B shows the charge potential distribution in case where a pre-dose area is divided as shown in FIG. 3A so that electric charge exists in a surrounding part (area B) uniformly and electric charge does not exist in the center part (area A).

In this case, the potential distribution in the center part becomes flat as compared with the case where the pre-dose area is not divided (FIG. 2B) but the potential in the area B is higher than that in the periphery thereof, so that the area where the potential distribution is flat is narrowed. Particularly, this inclination is remarkable in the area near to the sample (the height z from the sample is small).

Figure 3C:
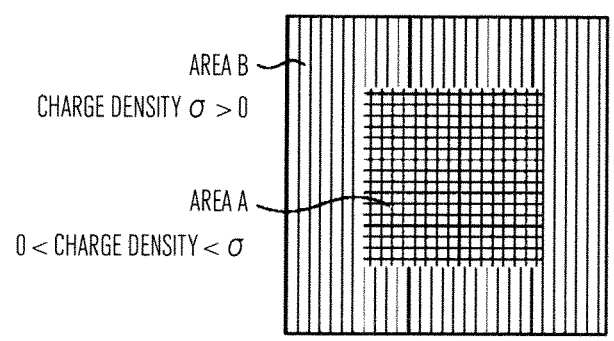
FIG. 3C illustrates the charge potential distribution in case where the charge densities on inner and outer sides of the pre-dose area are changed.
Figure 3D:
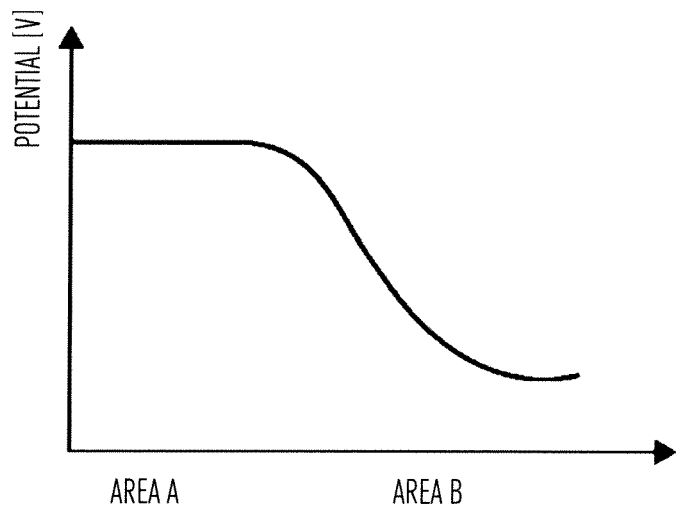
FIG. 3D illustrates the charge potential distribution in case where the charge densities on inner and outer sides of the pre-dose area are changed.

Now, FIG. 3D shows the potential distribution obtained by making the electric charge in the center part of the pre-dose area smaller than that in a surrounding part instead of reducing the electric charge in the center part to zero completely. In this case, the distribution is flatter as compared with the case of FIG. 3B. In this manner, the charge distribution in which the charge density on the outer side is increased with a certain gradient instead of reducing the charge distribution in the center part of the pre-dose area to zero completely is optimum to form the desired potential distribution.

As illustrated in FIG. 3C, if the charge distribution in which the charge density in the surrounding part is higher than the charge density in the center part of the pre-dose area is realized, uniform charge potential can be formed.

Various scanning methods of forming the uniform charge in the observation area are now described in more concretely.

Embodiment 1

In order to attach the charge to the sample uniformly, scanning is made so that the charge density per unit area of the inside area within the scanned area of the electron beam is lower than that of the outside area within the scanned area.

Figure 4A:
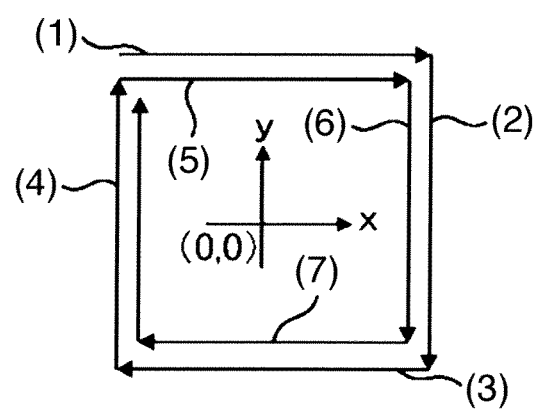
FIG. 4A illustrates a scanning signal for rectangular scanning.

As an example of such a scanning method, there is a scanning method as illustrated in FIGS. 4A, 4B and 4C.

When the primary beam is scanned on the sample so that a square is drawn on the sample as shown in FIG. 4A, an irradiation area in the form of a square frame can be formed. In the embodiment, an example in which such a scanning method is applied to preliminary scanning of the sample is described. FIG. 4A illustrates the scanning order that scanning is made from the outside to the inside of the scanned area in order as shown by (1) to (7), although scanning may be made from the inside to the outside of the scanned area in order. Further, the faster the scanning speed is, the less the number of irradiation electrons (hereinafter referred to as a dose amount) is.

The scanning signal at the time that the scanning illustrated in FIG. 4A is performed is illustrated in FIG. 4B. FIG. 4C shows transition of x and y scanning signals corresponding to first to seventh beam irradiation lines of FIG. 4C where the horizontal axis is represented by time t [sec]. In this figure, V represents a maximum deflection voltage in x or y direction, Np the number of pixels in one direction of the pre-dose irradiation area, $t_i$ (i=1, 2, ... ) a scanning time of one line and $t_{scan}$ a scanning time per pixel. When the scanning speed is fixed, the scanning time is represented by the following expression:

$$T_{scan} = t_n - t_{n-1} \quad \text{(Expression 1)}$$

Further, the inclination of the x and y signals is fixed (α of FIG. 4B) without being changed together with the scanning time.

When the scanning in the form of frame as shown in FIG. 4A is performed, the inner scanning line is shorter than the outer scanning line. FIG. 4C shows an example of the scanning signal having the scanning speed which is faster as the scanning line goes inward.

Here, the shorter the length of the scanning line is, the faster the scanning speed is. Accordingly, as shown in FIG. 4C, the larger the inclination of the x and y scanning signals is, the shorter the scanning line is (in FIG. 4C, α1<α2<α3 ... ).

The frame-like scanning signal going from the inside to the outside corresponds to the signals advanced inversely in time t in FIGS. 4B and 4C. According to the above-described scanning method and an application example of the scanning method, uniform potential distribution can be formed.

Figure 5A:
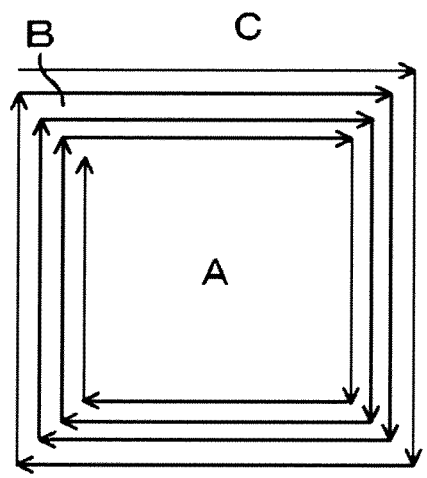
FIG. 5A illustrates rectangular scanning excepting the center part of the pre-dose area.

In case of the frame-like scanning having the fixed speed, the pre-dose area is divided to make irradiation of beam. One concrete example is shown in FIG. 5A. The center part A is not irradiated with the primary beam and only the surrounding part B is subjected to pre-dose in which irradiation is made in rectangular scanning. When the electric charge accumulated in the sample by irradiation of beam does not spread by the time observation is made after irradiation of beam, the charge density in the area A is reduced to zero at the time of observation. However, in case of material in which the accumulated charge spreads because of any reason by the time observation is made, the charge distribution in which the charge density in the area A is low and the charge density in the area B is high can be formed. Accordingly, as shown in FIG. 3D, the horizontal gradient of potential in the center part A can be reduced and the deviation in the field of view upon observation can be prevented.

Embodiment 2

Figure 6A:
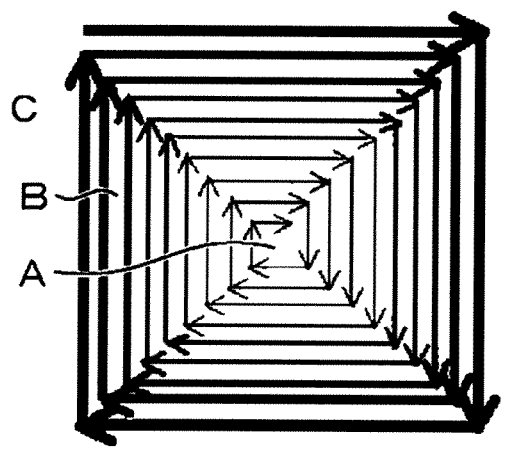
FIG. 6A illustrates rectangular scanning performed while changing a scanning speed.
Figure 6B:
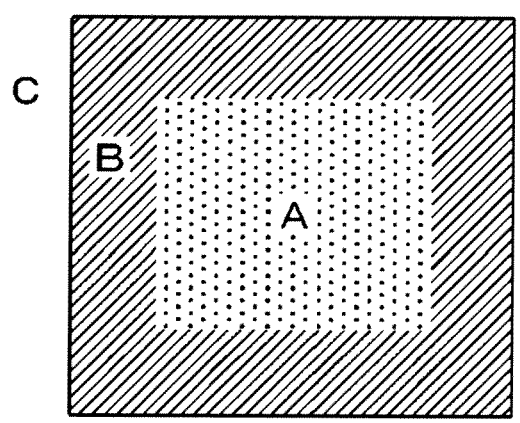
FIG. 6B illustrates rectangular scanning performed while changing the scanning speed.

In the pre-dose based on the scanning method illustrated in the embodiment 1, when the area of the center part A of FIG. 5A is reduced to zero, a square irradiation area can be formed as shown in FIG. 6A. In the embodiment, scanning is continued from the outside to the inside and the scanning signal is controlled so that the scanning speed is made faster as the center part A is approached. In this case, since the charge amount per unit area is gradually reduced from the outside to the inside, the charge distribution in which the charge density in the center part A is low and the charge density in the surrounding part B is high can be formed as shown in FIG. 6B. As a result, when the electric charge accumulated in the sample by the time observation is started after pre-dose does not spread excessively, substantially uniform potential distribution can be formed in the center part A and the deviation in the field of view upon observation can be prevented as shown in FIG. 3D.

Embodiment 3

As a combination of the scanning methods of FIGS. 5A and 6A, the pre-dose method in which the scanning speed is made faster as the center part A of FIG. 5A is approached and inversely the scanning speed is made slower as the outer part C is approached is also applicable. In this case, it is preferable that an adjustment apparatus which can adjust the sizes of areas A and B freely is provided so that the sizes can be adjusted in accordance with a kind of the sample or optical conditions of the electron microscope. In this method, the charge density in the center part A is zero and the density in the surrounding part B is slowly increased from the area A to the area C, so that the potential distribution can be uniformed. As a result, the horizontal shift of the primary beam in observation can be prevented and deviation in the field of view in observation can be prevented.

Embodiment 4

Figure 7A:
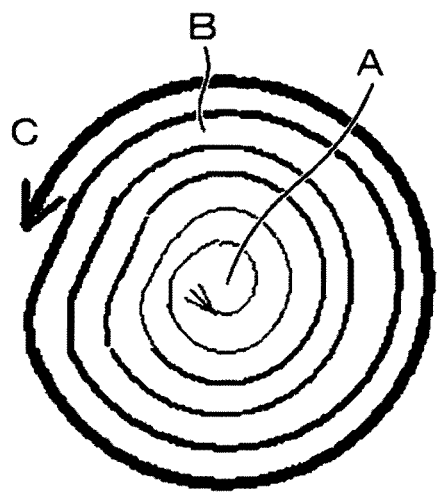
FIG. 7A illustrates circular scanning performed while changing the scanning speed.

As illustrated in FIG. 7A, when the primary beam is scanned to draw a spiral on the sample, a circular irradiation area can be formed. Hereinafter, such scanning is named circular scanning. The circular scanning contains the scanning performed from the outside A to the inside B of the spiral drawn on the sample by the primary beam and the scanning performed from the inside B to the outside A. The scanning signal of the circular scanning in the two-dimensional x-y plane is represented by the following expression:

$$x(t) = V(t)\cos(\omega t) \quad \text{(Expression 2)}$$

$$y(t) = V(t)\sin(\omega t) \quad \text{(Expression 3)}$$

where the center is x=y=0.

V(t) represents a voltage which is proportional to the distance of the irradiation position from the center, $\omega(t)$ a rotational speed of the circular scanning and t a scanning time. The radius of the circular pre-dose area is defined to be R. A deflection voltage Vo is required to deflect the primary beam to the distance of the radius R from the center and a necessary time for scanning the whole pre-dose area once (scanning for one frame) is defined to be $T_{frame}$.

When the circular scanning is performed from the inside to the outside, the voltage V(t) is changed from 0 to Vo until the scanning time reaches the time $T_{frame}$ starting from 0 and inversely when the circular scanning is performed from the outside to the inside, the voltage V(t) is changed from Vo to 0.

Next, the circular scanning signal is described. When irradiation is made with a fixed probe current, the dose amount per unit area is proportional to $1/(V(t)\omega(t))$. Accordingly, when the dose amount is fixed, $V(t)\omega(t)$ is fixed and in order to increase the dose amount, $V(t)\omega(t)$ is reduced.

When the charge density in the pre-dose area is changed continuously, the rotational speed $\omega(t)$ is changed as follows. Thus, the circular scanning going from the inside to the outside is hereinafter described. Since the voltage V is increased as the outermost part in the pre-dose area is approached, the rotational speed $\omega$ must be reduced at the faster rate as compared with the increased rate of the voltage V in order to increase the charge density on the outside. For example, when the voltage V(t) is proportional to the scanning time t, the dose amount is increased as the outermost part is approached by making the rotational speed $\omega$ proportional to $t^{-(1+\alpha)}$ (where $\alpha>0$).

Figure 8A:
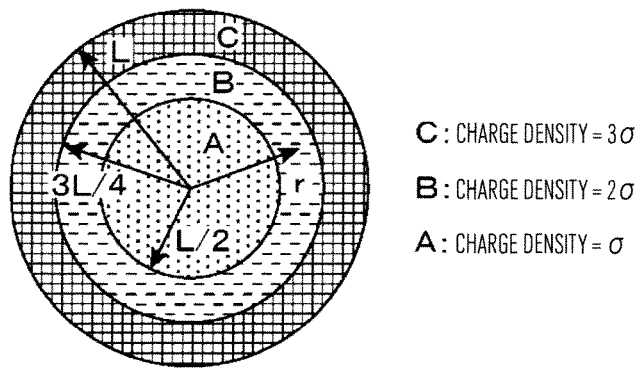
FIG. 8A illustrates the charge potential distribution formed by the scanning signal during preliminary irradiation and the preliminary irradiation in an example of circular preliminary irradiation performed while changing the scanning speed.

Next, control of the rotational speed w in case where the charge density in the pre-dose area is changed discontinuously is described using concrete examples of FIGS. 8A, 8B, 8C and 8D. As shown in FIG. 8A, the circular pre-dose area having the radius R is divided at the rate of 2:3:4 in the radius from the center part A to the outside and divided parts are named A, B and C, respectively. The case where the dose amounts of A, B and C are 1:2:3 is described.

Figure 8B:
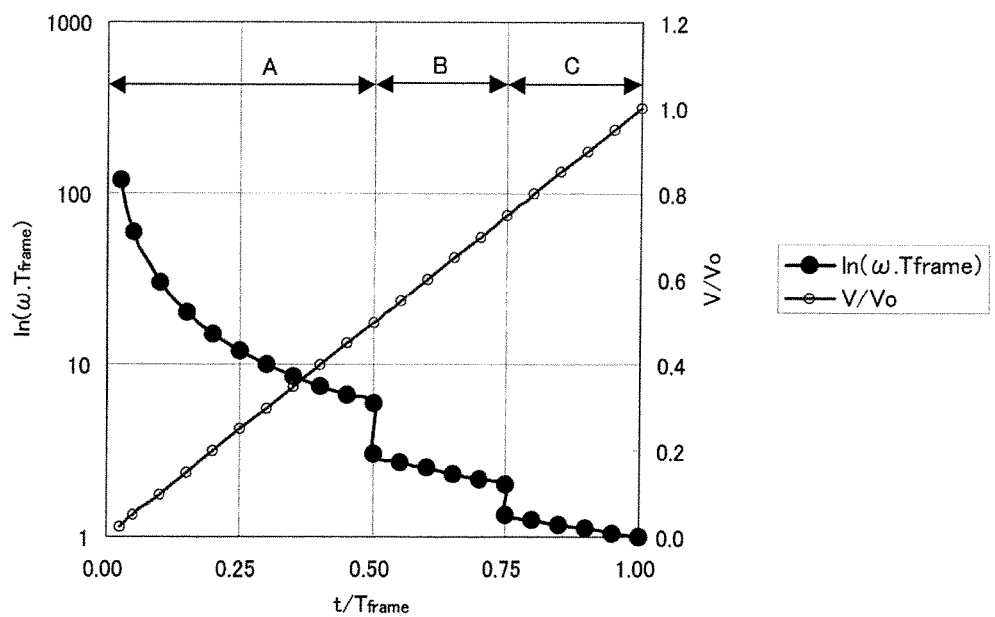
FIG. 8B illustrates the charge potential distribution formed by the scanning signal during preliminary irradiation and the preliminary irradiation in an example of circular preliminary irradiation performed while changing the scanning speed.

The voltage V(t) is supposed to be proportional to the time t in the circular scanning going from the inside to the outside. The rotational speed to of the circular scanning in areas is proportional to 1/t and proportional coefficients in A, B and C are supposed to be κA, κB and κC, respectively. If adjustment is made to be κA:κB:κC=3:1.5:1, the dose amounts in A, B and C are 1:2:3 and the charge distribution in the pre-dose area is as shown in FIG. 8A. The voltage V(t) and the rotational speed $\omega(t)$ in this case are shown in FIG. 8B. Here, time in the horizontal axis is standardized by the scanning time $T_{frame}$ of one frame, the rotational speed $\omega$ in the vertical axis is represented by $\ln(\omega T_{frame})$ and the voltage V is standardized by Vo.

Figure 8C:
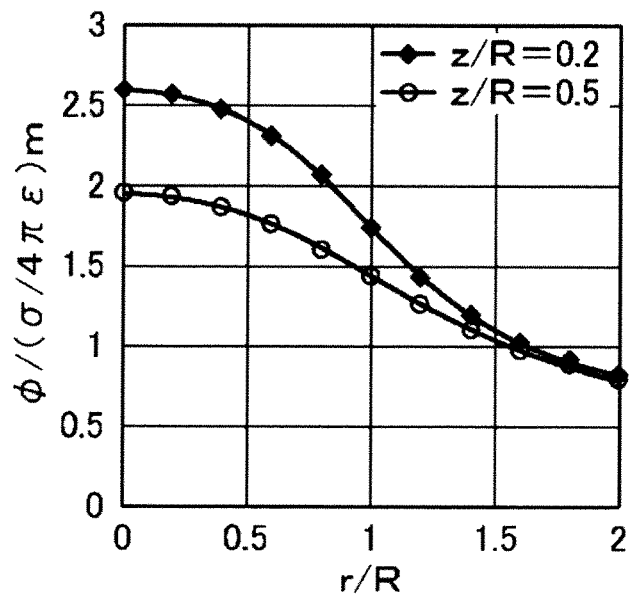
FIG. 8C illustrates the charge potential distribution formed by the scanning signal during preliminary irradiation and the preliminary irradiation in an example of circular preliminary irradiation performed while changing the scanning speed.
Figure 8D:
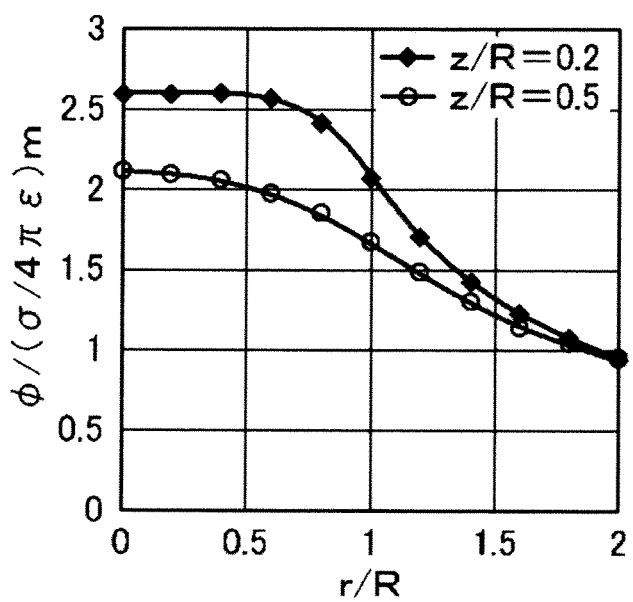
FIG. 8D illustrates the charge potential distribution formed by the scanning signal during preliminary irradiation and the preliminary irradiation in an example of circular preliminary irradiation performed while changing the scanning speed.

The charge potential formed by the charge distribution of FIG. 8A is calculated numerically and its result is shown in FIG. 8D. The potential distribution in case where the charge density is fixed over the whole pre-dose area ($V(t)\omega(t)$=fixed) is shown in FIG. 8C. Here, the vertical axis represents the potential $\Phi$ standardized by $\sigma/4\pi\varepsilon o$ and having the unit of m. Further, the horizontal axis is a dimensionless amount of the distance r standardized by the radius R. FIG. 8D shows potential distribution obtained in two surfaces in heights z from the sample which are equal to 0.2R and 0.5R (z=0.2R and 0.5R). As compared with FIGS. 8C and 8D, it can be understood that the horizontal gradient of the charge potential is lessened in half of the inside part (area A) of the pre-dose area by reducing the charge density on the inside of the pre-dose area and increasing the charge density on the outside thereof. When the gradient between r=0 and r=0.5R is approximated by straight line on the surface in height z=0.2R, the force in the horizontal direction acting on the primary beam in observation is, when division is made as shown in FIG. 8B, about 1/4.5 of the force in case where division is not made.

As described above, the gradient can be formed in the charge distribution in the pre-dose area, so that the uniform charge potential can be realized to prevent curvature of the orbit of the primary beam in observation, so that deviation in the field of view, shift in the focus or distortion in the image can be prevented.

In the above example, the scanned area is divided into three areas, although the number of divided areas may be changed freely and the dose amounts in the areas may be also adjusted freely, so that the optimum conditions for uniforming the charge potential in accordance with material of the sample can be selected.

Embodiment 5

Figure 9A:
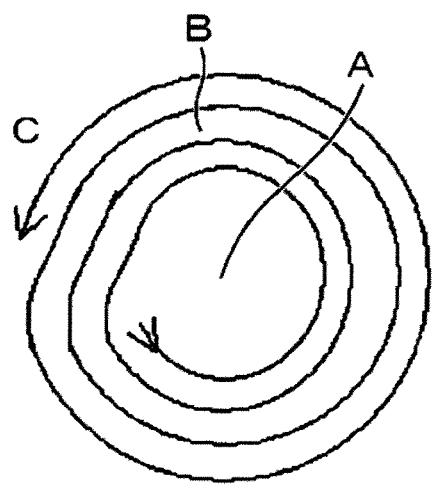
FIG. 9A illustrates circular scanning excepting the center part of the pre-dose area.
Figure 9B:
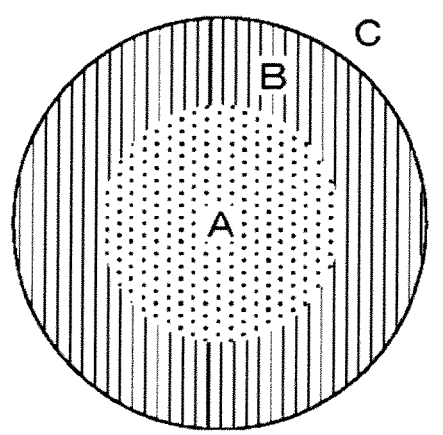
FIG. 9B illustrates circular scanning excepting the center part of the pre-dose area.

In case of material in which electric charge accumulated in the sample by pre-dose irradiation moves within the sample and spreads by the time the observation is started after pre-dose, a method in which the center part of the pre-dose area is not irradiated with the primary beam in the pre-dose method described in the embodiment 4 is adopted. This is the pre-dose method in which as shown in FIG. 9A the center part A is not irradiated with the primary beam and only the surrounding part B is irradiated. The sizes of areas A and B can be adjusted freely. As shown in FIG. 9B, in case of material in which the accumulated charge spreads, the charge distribution in which the charge density in the center part A is reduced (not zero) and the charge density in the surrounding part B is increased can be formed. Accordingly, in case of the material in which the electric charge accumulated in the sample by pre-dose spreads, the potential distribution is as shown in FIG. 8D and the horizontal gradient of potential in the center part A is reduced. As a result, horizontal shift of the primary beam in observation is reduced and deviation in the field of view is also made small.

Embodiment 6

When the electric charge accumulated in the sample does not spread within the sample by the time observation is started after pre-dose, the dose amount of preliminary irradiation can be changed in the embodiment 5. In other words, this is the pre-dose method in which the dose amount is reduced as the center part A is approached and the dose amount is increased as the outer part C is approached. In this method, the charge density in the center part A is reduced to zero and the density in the surrounding part B is increased slowly from the area A to the area C, so that the potential distribution can be uniformed. As a result, the horizontal shift of the primary beam and deviation in the field of view in observation can be prevented.

Embodiment 7

Figure 10A:
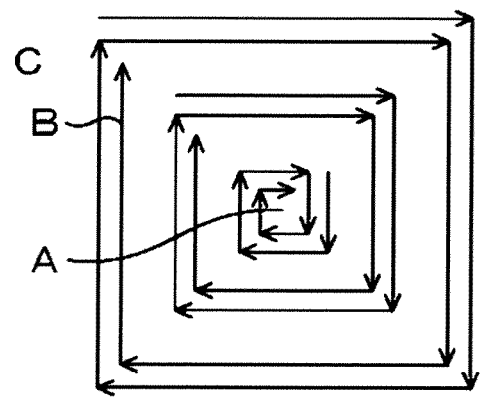
FIG. 10A illustrates a pre-dose method in which preliminary irradiation areas are distributed dispersedly.
Figure 10B:
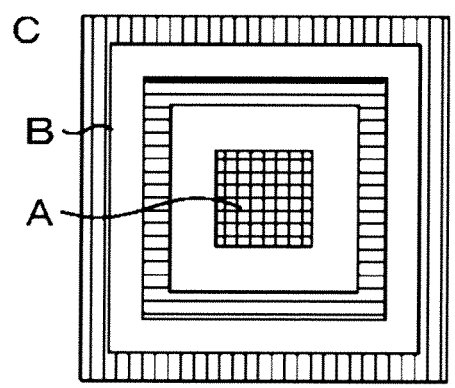
FIG. 10B illustrates a pre-dose method in which preliminary irradiation areas are distributed dispersedly.
Figure 10C:
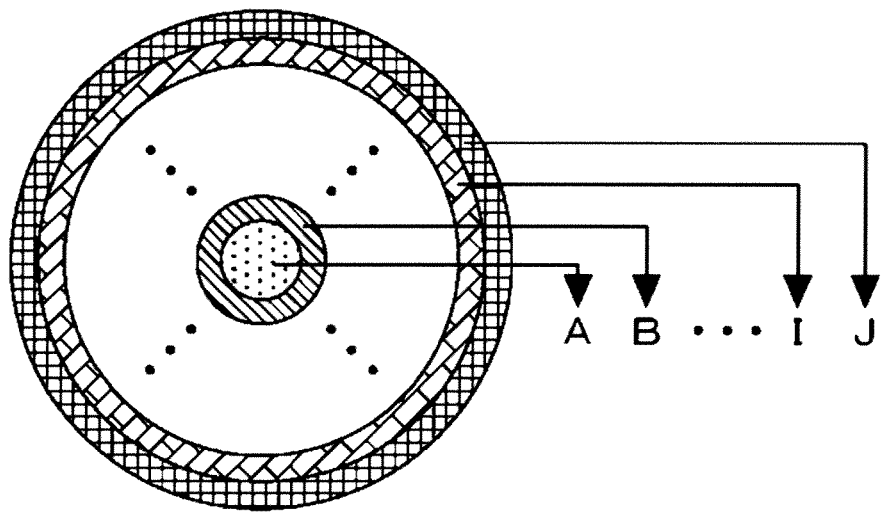
FIG. 10C illustrates a pre-dose method in which preliminary irradiation areas are distributed dispersedly.

According to the above-mentioned embodiment, the method in which the preliminary irradiation to the center part of the pre-dose area is reduced (or not irradiated) so that the charge density in the center part is reduced and the charge density in the surrounding part is increased to thereby form the uniform charge potential has been described. Next, description is made to the case where the area which is not irradiated with the primary beam during the pre-dose is not limited to the center part and irradiation with the beam is made dispersedly, so that the charge potential distribution can be formed uniformly. This method can be realized by the frame-like scanning or circular scanning method. FIGS. 10A, 10B and 10C illustrate examples of the frame-like scanning method. When the primary beam is irradiated dispersedly as shown in FIG. 10A, the dispersed charge distribution can be formed as shown in FIG. 10B. High-speed blanking is adopted in order to form unirradiation areas between the irradiation areas.

Figure 10D:
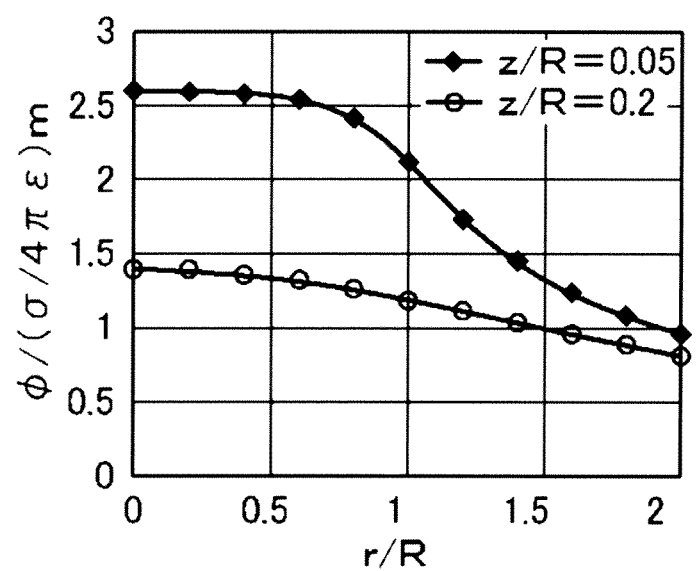
FIG. 10D illustrates a pre-dose method in which preliminary irradiation areas are distributed dispersedly.
Figure 10E:
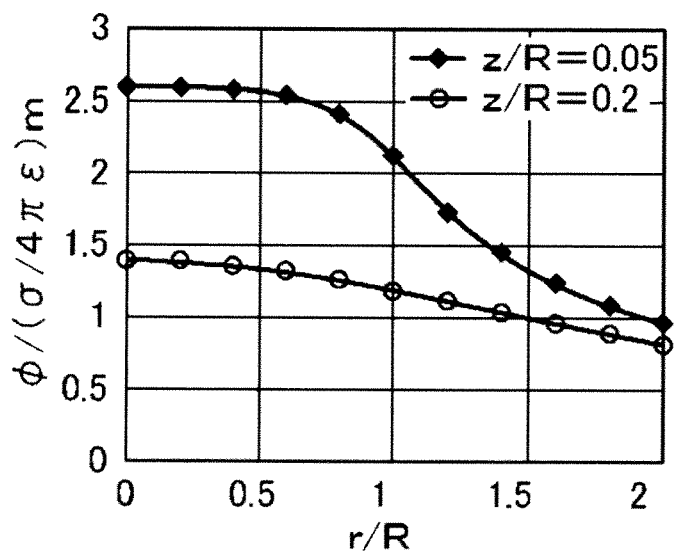
FIG. 10E illustrates a pre-dose method in which preliminary irradiation areas are distributed dispersedly.

A concrete example in which the pre-dose area is divided to be irradiated is now described. For example, as shown in FIG. 10C, the circular pre-dose area is divided into ten areas and the divided areas are named A, B, C, D, E, F, G, H, I and J, respectively, from the inside to the outside of the pre-dose area. All divided areas are not shown in FIG. 10C and only areas I and J in the surrounding part and only areas A and B in the center part are shown. Only the areas A, B, D, F, H and J are irradiated with the primary beam during pre-dose. In this case, the scanning speed is adjusted so that the charge densities in preliminary irradiation areas have the ratio of J:H:F:D:B:A=4:3:2:1:1:1. FIG. 10D shows the result of numerical calculation of the charge potential in this case. It is understood from this figure that uniform charge potential is formed in a half area on the inside of the pre-dose area. The above example is the case where electric charge accumulated in the sample does not spread, although this method can be also applied to even the case where the accumulated charge spreads. For example, it is supposed that electric charge accumulated in the sample spreads by the time observation is performed after pre-dose, so that the charge densities have the ratio of 4:0.5:3:0.5:2:0.5:1:0.5:1:1 from the area J to the area A. FIG. 10E shows the result of numerical calculation of the charge potential in this case. As compared with FIGS. 10D and 10E, when the primary beam is irradiated dispersedly as described above, influence by spread of the accumulated charge during pre-dose is reduced and it is said that uniform charge potential can be formed even in any case.

Embodiment 8

Figure 5B:
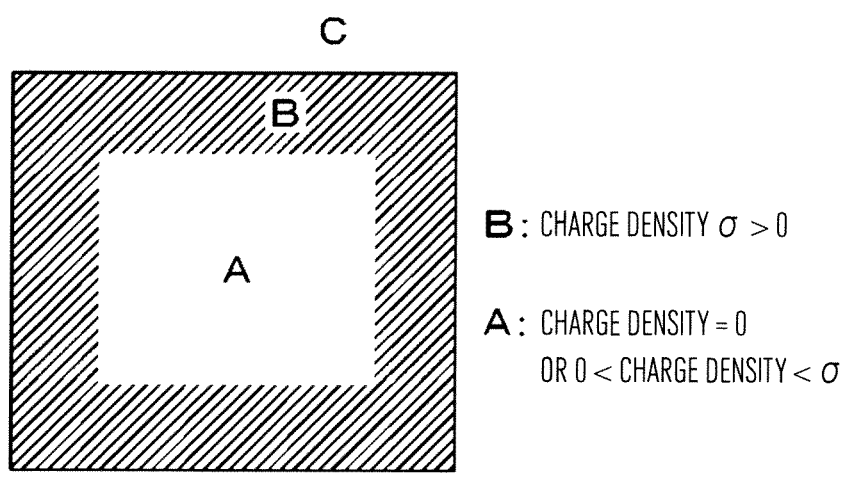
FIG. 5B illustrates rectangular scanning excepting the center part of the pre-dose area.

The scanning method used frequently in the scanning electron beam apparatus such as the scanning electron microscope is the raster scanning The charge distribution as shown in FIGS. 5B and 6B can be formed using the raster scanning without using the circular scanning or the like. The embodiment thereof is described below with reference to the drawings.

In the embodiment, an example in which the raster scanning and the high-speed blanking are combined to form the charge distribution as shown in FIGS. 5B and 6B is described.

Figure 11:
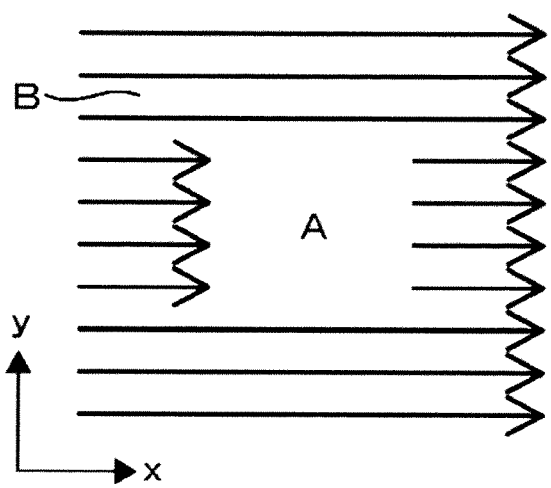
FIG. 11 illustrates raster scanning in which the center part of the pre-dose area is not irradiated with a beam.
Figure 12:
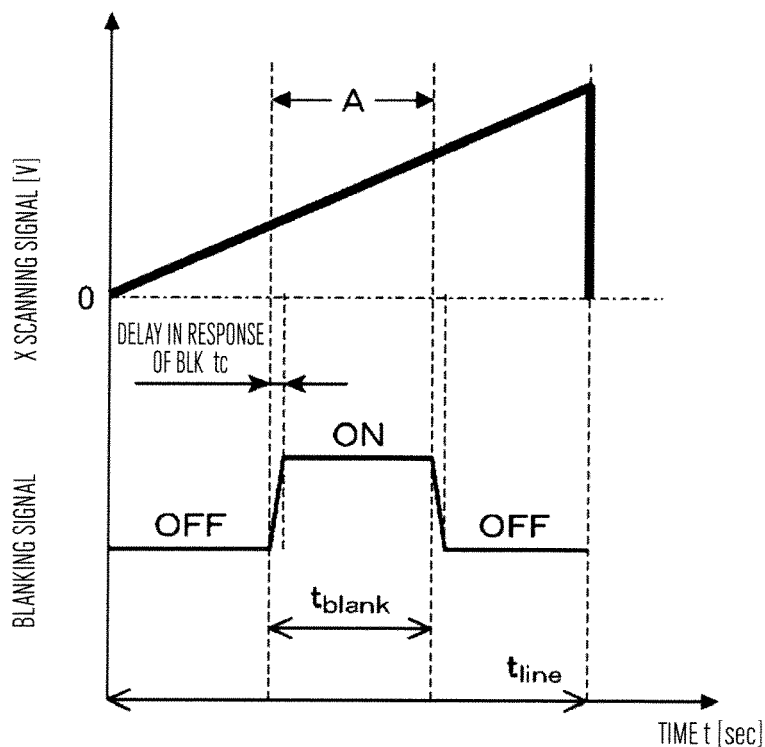
FIG. 12 illustrates raster scanning signal and blanking signal in which the center part of the pre-dose area is not irradiated with a beam.

As shown in FIG. 11, the pre-dose method in which only the surrounding part B is scanned by the raster method except the center part A is adopted. The sizes of the areas A and B can be adjusted freely. In order to prevent scanning by the primary beam in the center part A, it is necessary to adopt blanking which operates sufficiently faster than the scanning time of one line. FIG. 12 shows the relation of x scanning signal and blanking signal in the center part A at this time. Here, $t_{blank}$ represents time for blanking, $t_{line}$ time for scanning one line and tc delay in response of blanking. When the length of the center part A in the pre-dose area in the x direction is L, the blanking time $t_{blank}$ is represented by the following expression:

$$t_{blank}=L \cdot ts/N_p \qquad \text{(Expression 4)}$$

where ts=time for scanning 1 pixel and Np=the number of pixels in x direction. The blanking used is required to be tc≪$t_{blank}$.

In the above-described pre-dose method, in case of material in which electric charge accumulated in the pre-dose spreads, the charge distribution in which the charge density in the area A is low and the charge density in the area B is high can be formed. Accordingly, the same charge distribution as FIG. 6B can be formed and the potential distribution is as shown in FIG. 8D. As a result, the horizontal gradient of potential in the center part A can be reduced to thereby prevent deviation in the field of view in observation.

Embodiment 9

Figure 13:
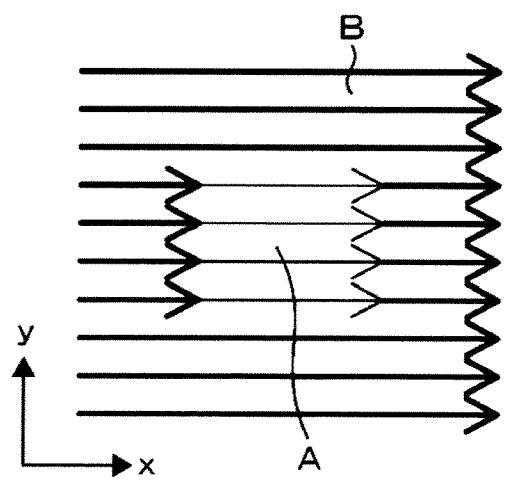
FIG. 13 illustrates raster scanning in which a dose amount to the center part of the pre-dose area is reduced.
Figure 14:
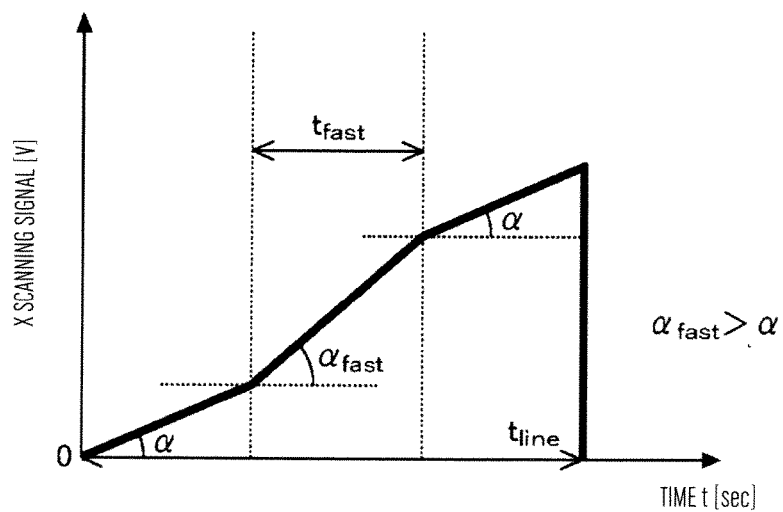
FIG. 14 illustrates raster scanning signal in which the dose amount to the center part of the pre-dose area is reduced.

When the electric charge accumulated in the sample by preliminary irradiation does not spread within the sample by the time observation is started after pre-dose, the raster scanning and the method of changing the scanning speed can be combined as shown in FIG. 13 to form the same charge distribution as FIG. 6B. FIG. 14 illustrates x scanning signal in the center part A of the embodiment. When the x scanning speed is changed and the time that high-speed scanning is made is $t_{fast}$, inclination $\alpha_{fast}$ of the x scanning signal during the time is larger than inclination $\alpha$ before and behind it. The time $t_{fast}$ is represented by the following expression:

$$T_{fast} = ts' \cdot np \qquad \text{(Expression 5)}$$

where ts' represents irradiation time per pixel in the high-speed scanning part and np represents the number of pixels in the x direction in the area A where the high-speed scanning is made.

In FIGS. 9A and 9B, part where line width is thick indicates that the scanning speed is slow and part where line width is narrow indicates the inverse thereof. FIG. 13 shows an example in which the scanning speed is changed at one level, although the scanning signal which is changed at multiple levels can be also generated similarly. In such a pre-dose method, the charge distribution in which as shown in FIG. 6B the charge density in the center part A is low and the charge density in the surrounding part B is high can be formed. As a result, as shown in FIG. 8D, substantially uniform potential distribution can be formed in the center part A and deviation in the field of view in observation can be prevented.

Embodiment 10

Figure 15:
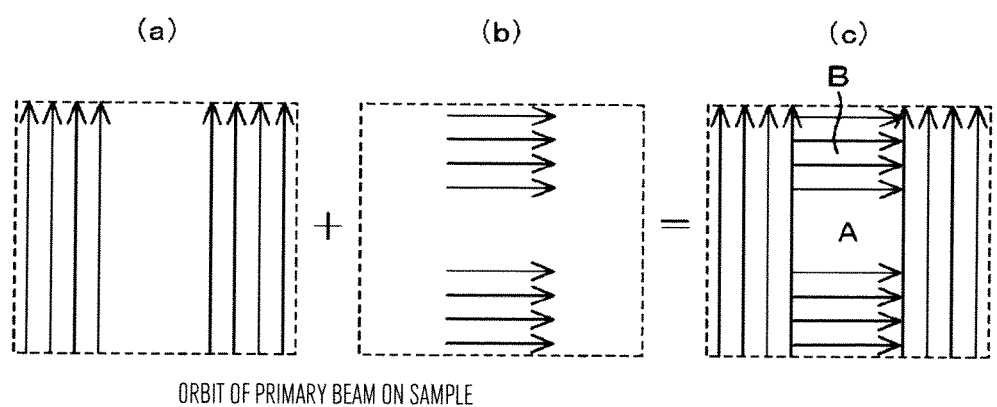
FIG. 15 illustrates the pre-dose in which the center part is not irradiated with a beam by a combination of vertical and horizontal raster scanning.

A beam scanning method of realizing the uniformity of charge in the pre-dose area without performing complicated control such as the high-speed blanking applied in the embodiment 8 and the variable speed raster scanning of the embodiment 9 is described. In the embodiment, as shown in FIG. 15, the vertical raster scanning and the horizontal raster scanning are performed while changing preliminary irradiation parts in the same area, so that the center part A is not irradiated with the primary beam and only the surrounding part B is irradiated. The sizes of areas A and B can be adjusted freely. The case where the electric charge accumulated in the sample by preliminary irradiation spreads and the case where the electric charge does not spread while scanning shown in FIG. 15(b) is performed after scanning shown in FIG. 15(a) are considered. In material in which the accumulated charge spreads, the charge distribution in which the charge density in area A is low and the charge density in area B is high can be formed. Accordingly, the same potential distribution as FIG. 8D can be formed and the horizontal gradient of potential in the center part A can be reduced, so that deviation in the field of view in observation can be prevented.

Embodiment 11

Figure 16:
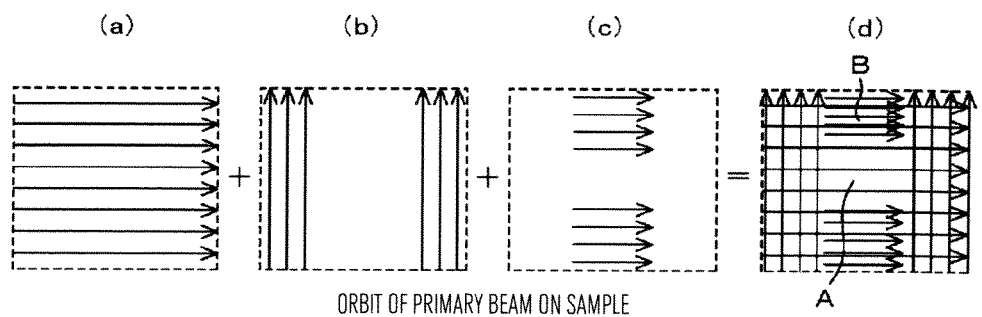
FIG. 16 illustrates the pre-dose in which the charge density in a surrounding part is increased by a combination of vertical and horizontal raster scanning.

When the electric charge accumulated in the sample by preliminary irradiation does not spread within the sample by the time observation is started after pre-dose, it is considered that the scanning method as illustrated in FIG. 16 is applied. This is the pre-dose method in which the vertical raster scanning and the horizontal raster scanning are combined while changing preliminary irradiation parts, so that the preliminary irradiation amount to the center part A is reduced as shown in FIG. 16(d) and the preliminary irradiation amount to the surrounding part B is increased. The sizes of areas A and B can be adjusted freely. Further, in FIG. 16, an example in which scanning at three levels is made is shown, although pre-dose at multiple levels is also considered. For example, the surrounding part is again scanned next to FIG. 16(d), so that the charge density in the surrounding part can be further increased. This method can form the charge distribution in which the charge density in the area A is low and the charge density in the area B is high. As a result, the same potential distribution as FIG. 8D can be formed, so that the horizontal gradient of the potential distribution in the center part A is reduced and deviation in the field of view in observation can be prevented.

Embodiment 12

Figure 7B:
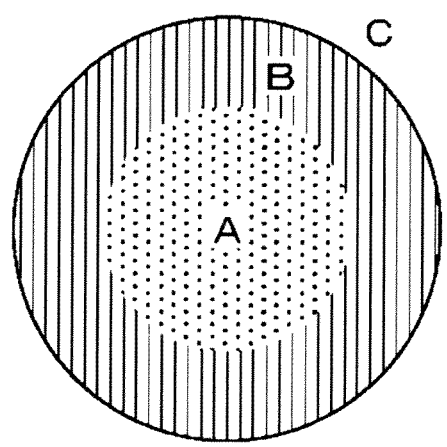
FIG. 7B illustrates circular scanning performed while changing the scanning speed.
Figure 17A:
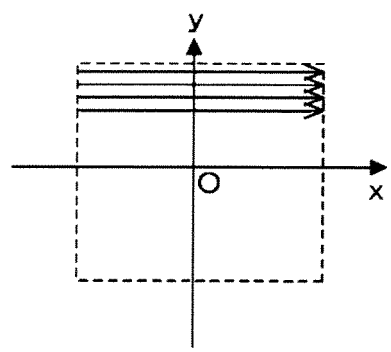
FIG. 17A illustrates the pre-dose in which the center part is not irradiated by a combination of raster scanning and raster rotation.
Figure 17B:
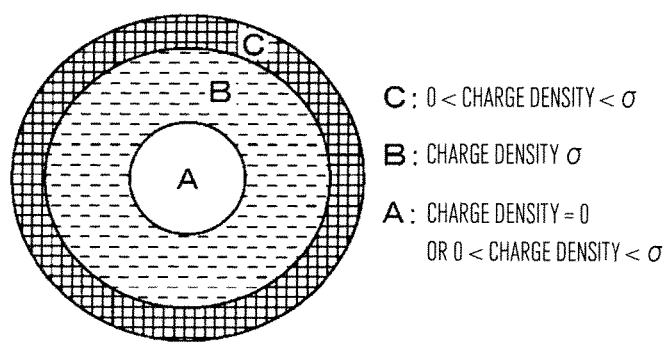
FIG. 17B illustrates the pre-dose in which the center part is not irradiated by a combination of raster scanning and raster rotation.

The conventional scanning electron microscope has the function of raster scanning and image rotation (raster rotation) and the raster scanning and the image rotation can be combined to form the circular pre-dose area. As shown in FIG. 17A, the image rotation of 360° is performed while the primary beam is raster-scanned on the area positioned below half of an image display picture. As a result, as shown in FIG. 17B, the center part A is not irradiated with the primary beam and only the surrounding part B is irradiated. In case of material in which the electric charge accumulated in the sample by pre-dose does not spread, the charge density in the center part A is zero, although in case of material in which the electric charge accumulated spreads due to any reason, the charge density in the center part A is not zero and as shown in FIG. 7B the charge distribution in which the charge density in the center part A is low and the charge density in the surrounding part B is high can be formed. Accordingly, in case of material in which the electric charge accumulated in the sample by pre-dose spreads, the potential distribution is as shown in FIG. 8D and the horizontal gradient of the potential distribution in the center part A is reduced. As a result, the horizontal shift of the primary beam in observation is reduced and deviation in the field of view is also reduced.

Embodiment 13

When the electric charge accumulated in the sample by preliminary irradiation does not spread within the sample by the time observation is started after pre-dose, the circular charge distribution as shown in FIG. 7B is realized by combination of the raster scanning and the image rotation and accordingly the following pre-dose method is considered.

Figure 18A:
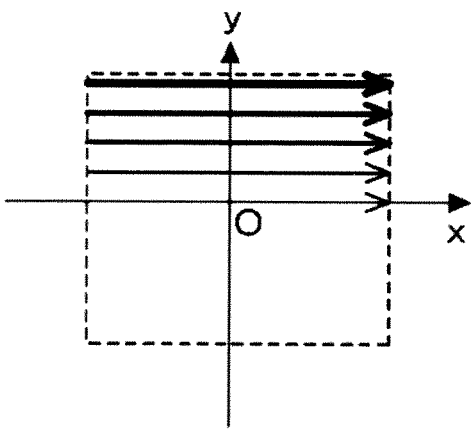
FIG. 18A illustrates the pre-dose in which an irradiation amount in the center part is reduced by a combination of raster scanning and raster rotation.
Figure 18B:
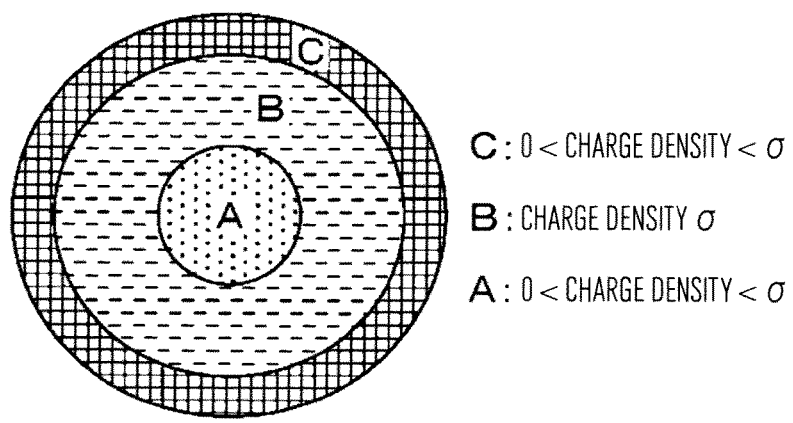
FIG. 18B illustrates the pre-dose in which an irradiation amount in the center part is reduced by a combination of raster scanning and raster rotation.

The first is the pre-dose by combination of the variable speed raster scanning and the image rotation (raster rotation). As shown in FIG. 18A, the image rotation of 360° is performed while the primary beam is raster-scanned on the area of half of the image display picture. In FIG. 18A, thick line indicates that the scanning speed is slow and narrow line indicates that the scanning speed is fast. As a result, as shown in FIG. 18B, the charge distribution in which the charge density in the center part A is low and the charge density in the surrounding part B is high can be formed.

Further, in another pre-dose method, the preliminary irradiation of the embodiment 12 is performed in the same area just after the raster scanning of FIG. 18A is performed at a fixed speed. In any case, in the material in which the electric charge accumulated in the sample by pre-dose does not spread, the potential distribution is as shown in FIG. 8D and the horizontal gradient of the potential distribution in the center part A is reduced. As a result, the horizontal shift of the primary beam in observation is reduced and deviation in the field of view is also reduced.

Moreover, as illustrated in FIG. 17, the raster rotation is performed while making blanking so that the area A is not irradiated with the beam, so that proper pre-dose can be performed to the sample in which the charge spreads.

As described above, the pre-dose is performed while making rotation, so that the charge can be formed axisymmetrically about the rotation center without applying complicated scanning pattern.

In the above description, the method of changing the scanning speed has been described as the means for changing the dose amount in the pre-dose, although current for the primary beam may be changed to thereby change the dose amount. However, in order to change the beam current, it is necessary to change excitation for the condensing lens or the like and there is considered that it is difficult to perform it during high-speed pre-dose scanning Actually, there are many cases where the distribution of electric charge accumulated in the sample after irradiation of pre-dose is changed in a short time and it is important that all preliminary irradiation methods described above can be performed faster as compared with the time. Accordingly, it is indispensable to increase the operation speed of the deflector 4 of FIG. 1. Generally, since the response of the magnetic coil is slow, it is considered that the electrostatic deflector having the fast response is required in order to perform pre-dose properly.

Embodiment 14

Figure 20:
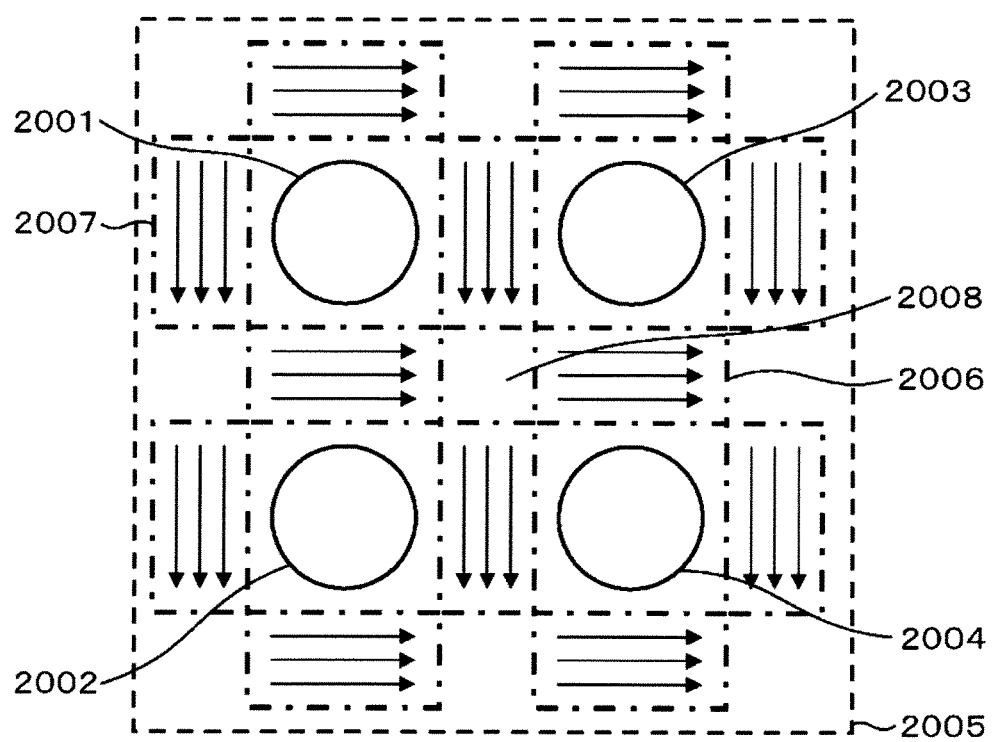
FIG. 20 is a diagram showing an example in which an area in which plural patterns exist is subjected to pre-dose.

Next, the pre-dose method applicable to the case where a plurality of objects to be measured are contained in the pre-dose area is described. FIG. 20 is a diagram explaining an example in which a plurality of objects to be measured (hole patterns 2001 to 2004) are contained in a pre-dose area 2005. In the example of FIG. 20, there are four hole patterns 2001 to 2004 and when charge is attached to the pre-dose area 2005 uniformly, the potential gradient in which the peak is positioned in the center of the pre-dose area 2005 is formed and there is a possibility that images of the hole patterns are distorted in accordance with positions thereof. Further, since the peak position of the charge and the centers of holes are separated from each other, electrons released from the bottom of holes are deflected and there is also a possibility that the detection efficiency of electrons is reduced by collision of electrons against the side walls of the holes.

Accordingly, in the embodiment, the method of arranging a plurality of scanning patterns (scanning patterns 2006 and 2007 in the embodiment) so as to enclose the hole patterns is proposed. As illustrated in FIG. 20, the same scanning patterns are arranged axisymmetrically about the center of the holes, so that high detection efficiency can be maintained while suppressing distortion in the images of the hole patterns.

Further, when influence of distortion due to potential gradient having the pre-dose area 2005 as the center is apprehended even if such a scanning method is applied, the beam scanning may be made on the scanning conditions that the size of unirradiation area 2008 is increased or the charge by the scanning pattern positioned outside is relatively increased as compared with the charge by the scanning pattern positioned inside, so that flatness of the potential distribution in the pre-dose area 2005 may be realized.

Figure 21:
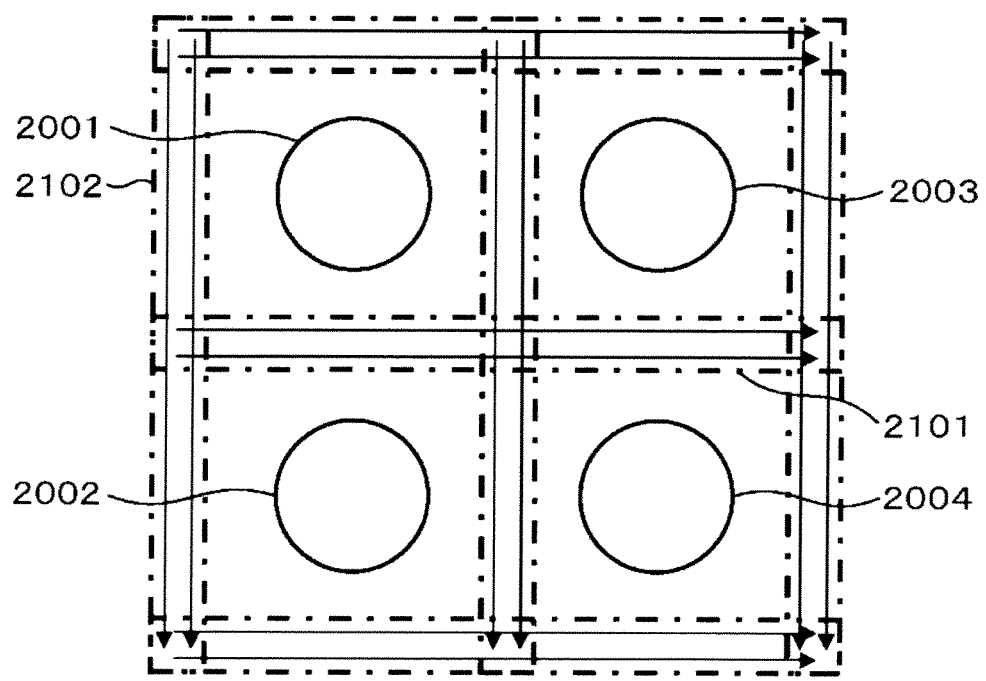
FIG. 21 is a diagram showing an example in which an area in which plural patterns exist is subjected to pre-dose.

Moreover, as illustrated in FIG. 21, the scanning pattern 2101 in the horizontal direction and the scanning pattern 2102 in the vertical direction may be combined in gridlike fashion to flatten the potential distribution. In this case, there is a possibility that potential difference occurs between intersection parts of the scanning pattern 2101 and the scanning pattern 2102 and the scanning area except the intersection, although such combination of scanning patterns may be adopted as far as the potential difference is within the permissible range. The combination of scanning patterns of FIG. 21 is simple as compared with the scanning patterns of FIG. 20 and accordingly there is an effect that control is easy.

Embodiment 15

Figure 22:
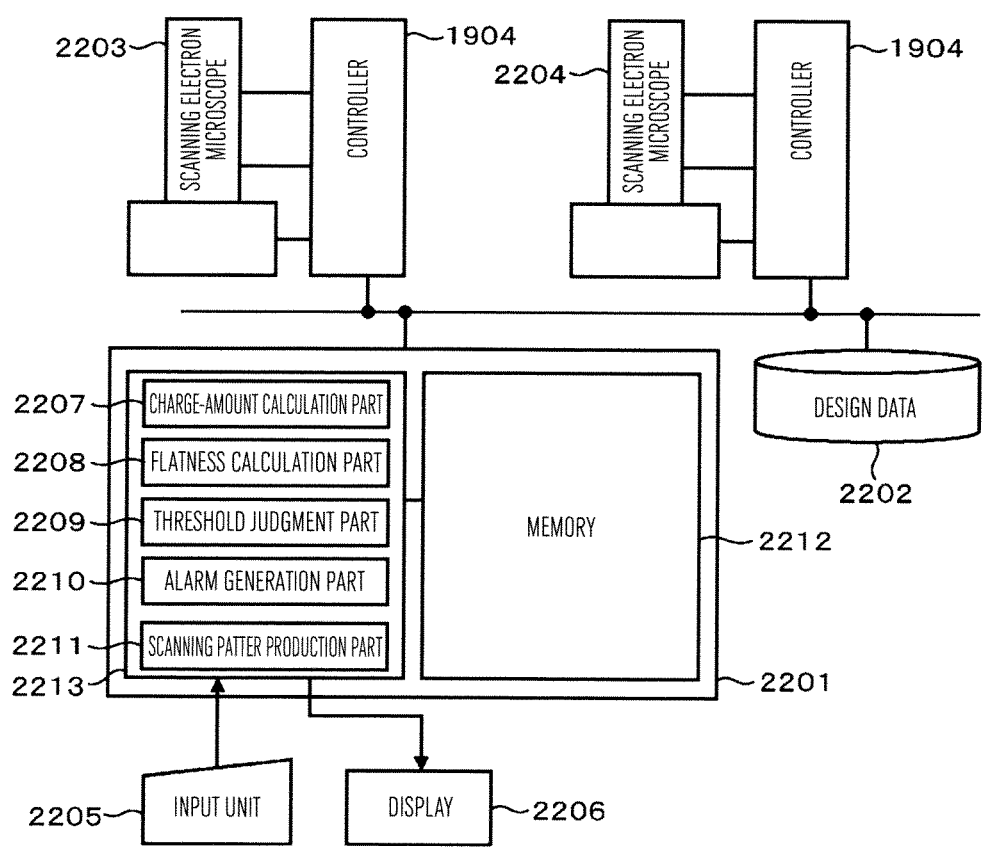
FIG. 22 is a diagram schematically illustrating an example of a sample inspection or measurement system including plural scanning electron microscopes.

FIG. 22 is a diagram schematically illustrating an example of an inspection or measurement system of a sample including a plurality of scanning electron microscopes. Connected to a computer network illustrated in FIG. 22 are controllers 1914 of scanning electron microscopes 2203, 2204, a recipe preparation device 2201 for preparing a recipe which is operation program in which operation conditions of the scanning electron microscopes are stored and a storage medium 2202 in which design data of semiconductor devices and the like is stored.

The design data stored in the storage medium 2202 is expressed by, for example, GDS format or OASIS format and is stored in a predetermined format. Further, the design data may be any kind if software for displaying the design data can display the format thereof and can treated the design data as diagram data. The recipe preparation device 2201 sets desired measurement points on design data, profile or border line data of patterns or the design data to which simulation is made and position for performing processing necessary for SEM such as automatic focusing, automatic stigma, addressing and the like and prepares program for automatically controlling the sample stage, the deflectors and the like of SEM on the basis of the setting. Moreover, pre-dose conditions are also registered in the recipe together and the controllers 1914 control the scanning electron microscopes 2203 and 2204 on the basis of the registered conditions.

Figure 23:
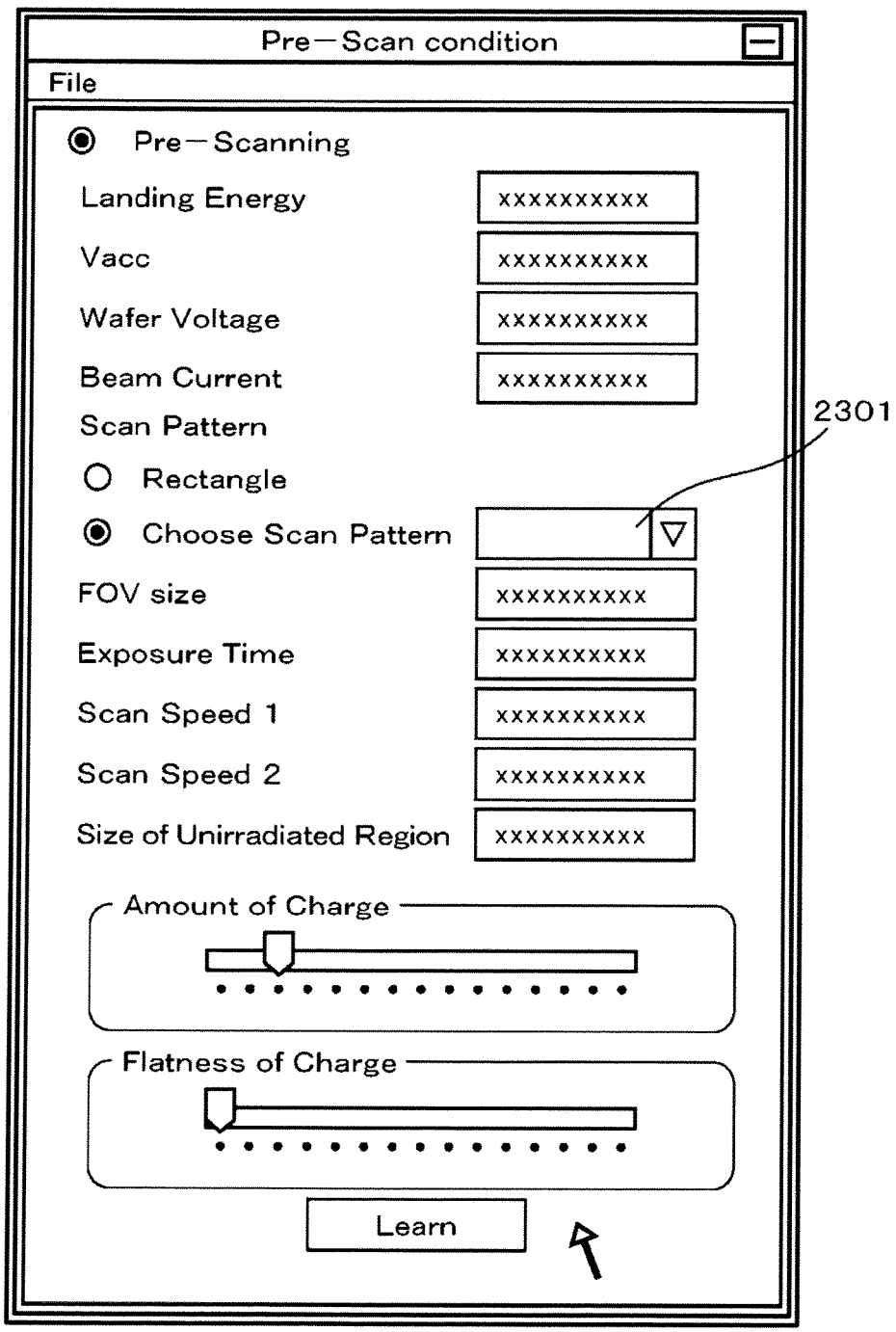
FIG. 23 is a diagram showing an example of a GUI picture for setting pre-dose conditions.

The recipe setting device 2201 includes a memory 2212 and an operation processing part 2213 and performs processing necessary for deciding pre-dose conditions. For example, the pre-dose conditions are set on a GUI (graphical user interface) picture as illustrated in FIG. 23 on the basis of the set conditions. On the GUI picture illustrated in FIG. 23, landing energy of beam to the sample, acceleration voltage (Vacc) of electron beam, application voltage to the sample (wafer voltage) and beam current can be set in order to be able to set various pre-dose conditions. However, as described above, when these conditions are changed, considerable processing time is required and accordingly it is preferable that these conditions are applied fixedly as far as possible.

On the GUI picture illustrated in FIG. 23, a mode of choosing a scanning pattern (Choose Scan Pattern) is selected instead of general rectangular scanning. The scanning pattern stored in the memory 2212 can be read out on the basis of such choice through a window 2301. Scanning patterns capable of being chosen are scanning patterns illustrated in the embodiments 1 to 14, for example. Such scanning pattern is chosen and size of scanned area (FOV size), irradiation or exposure time (Exposure Time) of beam, scanning speed in outside area within the pre-dose area (Scan Speed 1), scanning speed 2 in inside area within the pre-dose area (Scan Speed 2), size of unirradiated region of beam (Size of Unirradiated Region) and the like are set to thereby establish the proper pre-dose area.

The parameters described below the size of scanned area (FOV size) can be adjusted by control of the scanning deflector and blanking electrode (blanker) and accordingly the pre-dose conditions can be changed without changing optical conditions such as lens conditions. In other words, it is possible to set conditions that the throughput of the apparatus can be maintained to the high state.

The scanning conditions may be set on the basis of setting of the amount of charge (Amount of Charge) and the flatness of potential distribution (Flatness of Charge) instead of directly inputting the scanning conditions of beam. In other words, a large amount of charge is required as the hole is deeper and on the one hand since there is a possibility that attachment of excessive charge leaves influence such as deflection of beam when another object is measured, it is preferable that necessary and sufficient amount of charge is attached. On the other hand, when the amount of charge is changed, the flatness of charge distribution is also changed and accordingly it is preferable that the proper state can be set in accordance with the amount of charge.

Accordingly, a table in which the irradiation conditions of beam and the amount of charge (for example, a peak value of the charge amount or parameter changed in accordance with the charge amount) are related to be stored is previously stored in the memory 2212 and the irradiation conditions of beam are read out from the memory in accordance with setting of the charge amount to be set as the recipe. This table stores therein data for changing the irradiation time (that is increased as the charge amount is increased) or the scanning time (that is lengthened as the charge amount is increased) in accordance with the set amount of charge, for example. Further, the table stores therein data for flattening the change in potential within the pre-dose area by changing the size of the unirradiated region in the center of the pre-dose area or changing the scanning speed (Scan Speed 1) in the outside area or the scanning speed (Scan Speed 2) in the center area within the pre-dose area in accordance with setting of the flatness. The beam scanning conditions described below FOV size are preferably stored in the table stored in the memory 2212 in accordance with the optical conditions of the electron microscope or the sample conditions. The sample information may be inputted with reference to the design data stored in the storage medium 2202, for example, or may be inputted by an input unit 2205.

Further, instead of tabulating the relation of the scanning conditions and other conditions, an expression of calculating non-inputted information on the basis of inputted numerical information or information inputted by setting using sliders illustrated in FIG. 23 may be stored in the memory 2212 and its result may be displayed on the GUI.

A charge-amount calculation part 2207 in the recipe setting device 2201 calculates the charge amount or another parameter representative of the magnitude of the charge amount on the basis of selected scanning pattern information or the like. Further, a flatness calculation part 2208 calculates the potential gradient or the flatness in the pre-dose area on the basis of set scanning pattern information or the like. A threshold judgment part 2209 judges whether the potential gradient or the flatness calculated by the flatness calculation part 2208 satisfies the predetermined conditions or not (for example, the gradient is larger than the predetermined conditions or the flatness is lower than the predetermined conditions). An alarm generation part 2210 displays, when the apparatus condition judged by the threshold judgment part 2209 not to satisfy the predetermined condition is set, as a message to that effect in a display 2206. A scanning pattern production part 2211 produces a scanning pattern on the basis of the conditions inputted by the input unit 2205 while referring to the above table or the like.

According to the recipe setting device having the configuration as described above, proper pre-dose conditions can be set in view of the desired charge amount and flatness of potential.

In the embodiment, the recipe setting device 2201 and the controllers 1914 of SEM have been described as separate devices, although the recipe setting part may be included in the controller 1914 or recipe setting operation may be performed by a computer having another operation unit or set recipe (operation program) may be performed by an operation unit included in the controller 1914.

The above description has been made to the embodiments but the present invention is not limited thereto and it is apparent to those skilled in the art that various changes and modifications can be made without departing from the spirit of the invention and the attached claims of the invention.

REFERENCE SIGNS LIST 1 electron gun
2 electron beam
3 condensing lens
4 deflector
5 objective lens
6 sample
7 beam scanned area
8 secondary electrons
9 detector

The invention claimed is:

1. A scanning electron microscope including:
   an electron source;
   a scanning deflector to scan an electron beam emitted from the electron source on a sample;
   a detector to detect electrons obtained by scanning the electron beam on the sample;
   a controller to control the scanning deflector; and a non-transitory memory storing a control program,
   wherein the control program, when executed by the controller, causes the controller to:
      control the scanning deflector to scan an outer area of a scanned area selectively without scanning an inner area so that stronger positive charge is attached relatively to the outer area than the inner area, wherein the outer area is scanned selectively without scanning the inner area by using a blanking deflector during scanning for one frame,
         wherein the blanking deflector is turned on when the electron beam reaches the inner area,
      thereafter control the scanning deflector so that the electron beam is scanned on the inner area to detect electrons by the detector on a condition that the positive charge attached by scanning the electron beam remains, and
      measure a pattern which is included in the inner area by using the electrons detected by scanning the electron beam on the inner area.

2. The scanning electron microscope according to claim 1, further comprising:
   a blanker to blank the electron beam,
   wherein the control program, when executed by the controller, further causes the controller to control the blanker to blank the electron beam when the electron beam is scanned on the inner area.

3. The scanning electron microscope according to claim 1, wherein the control program, when executed by the controller, further causes the controller to control the scanning deflector so that scanning time of the electron beam on the inner area is shorter than scanning time of the electron beam on the outer area.

4. The scanning electron microscope according to claim 1, wherein the control program, when executed by the controller, further causes the controller to control the scanning deflector so that scanning speed of the electron beam on the inner area is faster than scanning speed of the electron beam on the outer area.

5. The scanning electron microscope according to claim 1, wherein the control program, when executed by the controller, further causes the controller to control the scanning deflector so that a plurality of scanning patterns having different scanning directions are combined to make scanning on the outer area.

6. The scanning electron microscope according to claim 5, wherein the control program, when executed by the controller, further causes the controller to control the scanning deflector so that scanning patterns in which the inner area is excluded to set a scanned area are combined to make scanning on the outer area.

7. The scanning electron microscope according to claim 5, wherein the control program, when executed by the controller, further causes the controller to control the scanning deflector so that scanning patterns in which scanning speed on the inner area is faster than scanning speed on the outer area are combined to make scanning of the electron beam.

8. The scanning electron microscope according to claim 1, wherein the control program, when executed by the controller, further causes the controller to control the scanning deflector so that the electron beam is scanned spirally.

9. The scanning electron microscope according to claim 8, wherein the control program, when executed by the controller, further causes the controller to control the scanning deflector so that the electron beam is scanned on the outer area selectively.

10. The scanning electron microscope according to claim 8, wherein the control program, when executed by the controller, further causes the controller to control the scanning deflector so that scanning speed on the inner area is faster than scanning speed on the outer area.

11. A control device for controlling a scanning electron microscope comprising a scanning deflector and a detector, the control device comprising:

a controller to control the scanning deflector; and a non-transitory memory storing a control program, the control program, when executed by the controller, causes the controller to:

control the scanning deflector to scan an the outer area of a scanned area selectively without scanning an inner area so that stronger positive charge is attached relatively to the outer area than the inner area, wherein the outer area is scanned selectively without scanning the inner area by using a blanking deflector during scanning for one frame, wherein the blanking deflector is turned on when the electron beam reaches the inner area, thereafter control the scanning deflector so that the electron beam is scanned on the inner area to detect electrons by the detector on a condition that the positive charge attached by scanning the electron beam remains, and measure a pattern which is included in the inner area by using the electrons detected by scanning the electron beam on the inner area.

12. A non-transitory memory, storing a computer program for controlling a scanning electron microscope comprising a scanning deflector and a detector, wherein the computer program, when executed by a controller, causes the controller to:

control the scanning deflector to scan an outer area of a scanned area selectively without scanning an inner area so that stronger positive charge is attached relatively to the outer area than the inner area, wherein the outer area is scanned selectively without scanning the inner area by using a blanking deflector during scanning for one frame, wherein the blanking deflector is turned on when the electron beam reaches the inner area, thereafter control the scanning deflector so that the electron beam is scanned on the inner area to detect electrons by the detector on a condition that the positive charge attached by scanning the electron beam remains, and measure a pattern which is included in the inner area by using the electrons detected by scanning the electron beam on the inner area.

* * * * *